US005925891A

United States Patent [19]

Koga et al.

[11] Patent Number: 5,925,891

[45] Date of Patent: Jul. 20, 1999

[54] FIELD-EMISSION ELECTRON SOURCE

[75] Inventors: Keisuke Koga, Kyoto; Yoshikazu Hori, Hyogo; Takehito Yoshida, Tokyo; Yuka Yamada, Kanagawa, all of Japan

[73] Assignee: Matsushita Electric Industrial Co., Ltd., Osaka, Japan

[21] Appl. No.: 08/833,191

[22] Filed: Apr. 14, 1997

[30] Foreign Application Priority Data

| | | | |
|---|---|---|---|
| Apr. 15, 1996 | [JP] | Japan | 8-092602 |
| Jan. 7, 1997 | [JP] | Japan | 9-000509 |

[51] Int. Cl.$^6$ .............................. H01L 29/06; H01J 1/16; H01J 19/10

[52] U.S. Cl. .............................. 257/10; 313/336; 313/304

[58] Field of Search ........................ 257/10, 11; 313/304, 313/336

[56] References Cited

U.S. PATENT DOCUMENTS

| | | | |
|---|---|---|---|
| 3,581,151 | 5/1971 | Boyle | 257/10 |
| 4,663,559 | 5/1987 | Christensen | 313/336 |
| 5,554,859 | 9/1996 | Tsukamoto et al. | 257/10 |

FOREIGN PATENT DOCUMENTS

| | | |
|---|---|---|
| 0 528 391 | 2/1993 | European Pat. Off. . |
| 0 637 050 | 2/1995 | European Pat. Off. . |
| 0 706 196 | 4/1996 | European Pat. Off. . |
| 0 712 147 | 5/1996 | European Pat. Off. . |
| 2 700 222 | 7/1994 | France . |
| 6-231675 | 8/1994 | Japan . |
| WO 94 20974 | 9/1994 | WIPO . |
| WO 95 26037 | 9/1995 | WIPO . |
| WO 96 00974 | 1/1996 | WIPO . |

OTHER PUBLICATIONS

Takai et al., "Enhancement in emission current from dry–processed n–type Si field emitter arrays after tip anodization", J. Vac. Sci. Technology B13 (2), pp. 441–444, 1995.

Yoshikazu Hori et al.: "Tower Structure Si Filed Emitter Arrays with Large Emission Current", Technical Digest of the International Electron Devices Meeting (IEDM), Wash., DC 10–13, 1995, Institute of Electrical and Electronic Engineers, pp. 393–396, XP 000624744.

K. Koga et al.: "New Structure Si Filed Emitter Arrays With Low Operation Voltage", 1995 IEEE International Conference On Systems, Man and Cybernetics, Vancouver, Oct. 22–25, 1995, vol. 1, Inst. of Electrical and Electronics Engineers, pp. 23–26, XP000585429.

*Primary Examiner*—John Guay
*Attorney, Agent, or Firm*—McDermott, Will & Emery

[57] ABSTRACT

A withdrawn electrode is formed on a silicon substrate with intervention of upper and lower silicon oxide films each having circular openings corresponding to regions in which cathodes are to be formed. Tower-shaped cathodes are formed in the respective openings of the upper and lower silicon oxide films and of the withdrawn electrode. Each of the cathodes has a sharply tapered tip portion having a radius of 2 nm or less, which has been formed by crystal anisotropic etching and thermal oxidation process for silicon. The region of the silicon substrate exposed in the openings of the upper and lower silicon oxide films and the cathode have their surfaces coated with a thin surface coating film made of a material having a low work function.

5 Claims, 23 Drawing Sheets

FIELD-EMISSION ELECTRON SOURCE

BACKGROUND OF THE INVENTION

The present invention relates to a field-emission electron source such as a cold-emission electron source having prospective applications to an electron-beam-induced laser, a flat solid display device, an ultra-high-speed extremely small vacuum element, and the like. More particularly, it relates to a field-emission electron source using a semiconductor which can be integrated and operated at a low voltage and a method of manufacturing the same.

As the progression of semiconductor micro-fabrication technology has enabled the manufacturing of an extremely small field-emission electron source, vigorous research and development has been directed toward the technology of vacuum microelectronics. To implement a high-performance field-emission electron source operable at a lower driving voltage, there has been adopted, e.g., the approach of producing a miniaturized withdrawn electrode and a sharply pointed cathode by using LSI technology.

Referring to FIGS. 19 to 21, there will be described a first conventional embodiment, which is an extremely small field-emission electron source formed by using a silicon substrate and a method of manufacturing the same disclosed in European Laid-Open Patent Publication No. 637050A2.

First, as shown in FIG. 19(*a*), a silicon oxide film 102 is formed by thermal oxidation on the (100) crystal plane of a silicon substrate 101 made of a silicon crystal, followed by the formation of a photoresist film 103 on the silicon oxide film 102.

Next, as shown in FIG. 19(*b*), the photoresist film 103 is processed by photolithography to form disk-shaped etching masks 103A each having a diameter of about 1 $\mu$m. Subsequently, the pattern of the etching masks 103A is transferred to the silicon oxide film 102 by dry etching for forming disk-shaped elements 102A, followed by the removal of the etching mask 103A.

Next, anisotropic dry etching is performed with respect to the silicon substrate 101 by using the disk-shaped elements 102A as a mask, thereby forming cylindrical elements 104A made of the silicon substrate 101 under the disk-shaped elements 102A. Thereafter, crystal anisotropic etching is performed with respect to the cylindrical elements 104A, thereby forming hourglass elements 104B each composed of a pair of truncated cones with their top surfaces joined to each other and having a side surface including the (331) crystal plane, as shown in FIG. 19(*d*).

Next, as shown in FIG. 20(A), a thin first thermal oxide film 105 is formed over the surfaces of the hourglass elements 104B and of the silicon substrate 101. Then, anisotropic dry etching is performed with respect to the silicon substrate 101 by using the disk-shaped elements 102A as a mask, thereby transforming the hourglass elements 104B into cylindrical elements 104C with respective hourglass heads.

Next, as shown in FIG. 20(*c*), a second thermal oxide film 106 is formed over the surfaces of the cylindrical elements 104C with respective hourglass heads and of the silicon substrate 101 so that tower-shaped cathodes 107 each having a sharply tapered tip portion and an extremely small diameter are formed inside the cylindrical elements 104C with respective hourglass heads.

Next, as shown in FIG. 20(*d*), insulating films 108 and metal films 109 are successively formed by vapor deposition on the disk-shaped elements 102A as well as on the silicon substrate 101 around the disk-shaped elements 102A.

Next, as shown in FIG. 21, wet etching is performed with respect to the second thermal oxide film 106, thereby removing the disk-shaped elements 102A in conjunction with the insulating films 108 and metal films 109 deposited thereon. This exposes the tower-shaped cathodes 107, while forming the metal film 109 into a withdrawn electrode 109A having an inner diameter equal to the diameter of the disk-shaped element 102A.

As a second conventional embodiment, there will be described a method of manufacturing a field-emission electron source using a material having a low work function disclosed in Japanese Laid-Open Patent Publication HEI 6-231675.

Japanese Laid-Open Patent Publication HEI 6-231675 proposes not only the approach of reducing the size of the cathode and improving the structure thereof described in the first conventional embodiment but also an attempt to improve the performance of the cathodes by selectively depositing the low-work-function material on the tip portions of the cathodes. In accordance with the manufacturing method, the formation of the cathodes is followed by oblique vapor deposition for selectively forming the low-work-function material on the surfaces of the tip portions of the cathodes. Thereafter, a thermal treatment is performed for silicidization. Thus, the manufacturing method intends a great increase in the efficiency of electron emission by lowering the work function at the tip portion of the cathode.

As a third conventional method, there will be described a method reported by M. Takai et al. (J. Vac. Sci. Technol. B13(2), 1995, p.441), wherein a porous layer is formed by anodization on the surface of a cathode.

As shown in FIG. 22, a thermal oxide film 106 formed with an opening corresponding to a region in which the cathode is to be formed is deposited on an n-type silicon substrate 101. In the region in which the cathode is to be formed, there is formed an extremely small cathode 107 made of silicon. On the thermal oxide film 106, there is formed a withdrawn electrode 109A made of Nb with an insulating film 108 interposed therebetween.

The surface of the cathode 107 has been anodized by means of an anodizing apparatus as shown in FIG. 23, whereby a porous layer 107*a* has been formed therein. The anodizing apparatus shown in FIG. 23 comprises: a reservoir 110 for storing a treating agent composed of $HF:H_2O:C_2H_5OH=1:1:2$; a sample holder 111 for holding a sample 112 disposed in the reservoir 110; a cathode electrode 113; and an anode electrode 114. In the treating agent, a specified current is allowed to flow between the cathode and anode electrodes 113 and 114 provided on both sides of the sample holder 111, while radiation from an excimer lamp is applied to the sample 112, thereby anodizing the surface of the cathode 107. During the anodization, the composition of the treating agent, the amount of current flowing through the treating agent, and irradiation conditions for the excimer lamp are optimized to form the porous layer 107A made of silicon and having a desired configuration and thickness in the surface region of the cathode 107.

The porous layer 107*a* formed in the surface region of the cathode 107 has numerous rods each having a diameter on the order of nanometers, which have been formed through the formation of numerous holes each having a diameter on the order of nanometers in the porous layer 107*a*. The numerous rods effectively serve as current emitting sites. This changes the cathode from point-emission type with one emitting site to surface-emission type with numerous emitting sites, resulting in an increased number of electron emitting sites and improved current-emitting property of the cathode.

Although the field-emission electron source according to the first conventional embodiment is operable at a low voltage due to the tower-shaped cathode having a sharply tapered tip portion with an extremely small diameter, it presents the following problem.

In practical applications of a field-emission electron source, stable and uniform emission of electrons is among critical requirements placed on the performance of the electron source.

In the first conventional embodiment, however, the current emitted from the cathode is greatly affected by vacuum atmosphere and the surface state of the tip portion of the cathode during operation, so that the physical property, such as work function, of the surface of the current emitting element is changed during current emission, causing a significant change in operating current. Hence, the requirement of stable and uniform emission of electrons mentioned above has not been satisfied by the first conventional embodiment. The cause of the unsatisfied requirement may be ions resulting from collisions between emitted electrons and a residual gas around the cathode during operation. The resulting ions collide with the tip portion of the cathode and thereby change the surface state of the tip portion of the cathode.

To suppress such current variations, there have been proposed a method wherein cathodes are integrated on a large scale to average individual variations in the quantity of emitted electrons and thereby stabilize the emitted current and a method wherein an additional element having a current suppressing effect, such as a FET, is provided to forcibly suppress current variations. However, the methods incur a significant increase in manufacturing cost because of lower device design flexibility and the necessity for an additional device structure, which presents a serious problem to the practical applications.

The tower-shaped cathode shown in the second embodiment, which has a surface coating film formed selectively of the low-work-function material on the tip portion thereof, has the following problem that, since the current emitted from the cathode flows intensively to the bottom portion of the tower-shaped cathode, high Joule heat is generated in the bottom portion of the tower when operation is performed with a large current. In the case where a current exceeding a maximum permissible value determined by the substrate resistance and the cross-sectional area of the tower is allowed to flow, the temperature of the cathode is raised by the generated Joule heat. If a temperature exceeding the melting point of the material composing the cathode is reached, the melted cathode may destroy the whole device.

Thus, in the second conventional embodiment, the maximum value of the current that can be allowed to flow to the cathode is lowered with increasing miniaturization of the cathode for reducing the operating current, which presents a large obstacle to operation with a large current.

Although the second conventional embodiment has the possibility of solving the problem because of the low-work-function material formed selectively on the tip portion of the cathode by oblique vapor deposition and subjected to the thermal treatment for forming a silicide film on the tip portion of the cathode, it also presents the following problem since the formation of the silicide film involves the process of forming the metal film by vapor deposition and the subsequent reaction process by thermal treatment.

In general, a film formed by vapor deposition is apt to have an unequal thickness over a wafer since a source of vapor is a point source. Moreover, since the subsequent process of forming a silicide film by thermal treatment utilizes a crystal reaction at the interface between the deposited metal and the underlying silicon substrate, the rate of the silicidization process and the quality of the resulting silicide film are likely to vary due to the unequal film thickness and non-uniform temperature, which causes a problem in the formation of the tip portion of the cathode that should be microstructured.

With the microstructured tip portion of the cathode, the radius of curvature of the tip portion is a parameter exerting a particularly great influence on the characteristics of the operating voltage during electron emission. If coefficients of electrostatic focusing are calculated for individual cathodes on the assumption that the structures of the cathodes are the same except for the radii of curvature of the tip portions, the coefficient of electrostatic focusing calculated for the cathode having the tip portion with the radius of curvature of 2 nm is double the coefficient of electrostatic focusing calculated for the cathode having the tip portion with the radius of curvature of 10 nm. In the second conventional embodiment, the radius of curvature of the tip portion of the cathode easily varies by about 10 nm under the influence of variations in the silicide process, resulting in varied device characteristics, which presents a serious problem to the practical applications.

Since the field-emission electron source according to the third conventional embodiment has the porous layer formed on the surface of the cathode, the number of electron emitting sites is increased with the changing of the cathode from point-emission type to surface-emission type. As a result, the electron emitting property of the cathode is improved to a certain degree, but not to a degree satisfactory for the practical applications.

Moreover, since the field-emission electron source according to the third conventional embodiment has the porous layer formed by anodization on the surface of the cathode, improvements have been intended in device characteristics such as operation at a low voltage and an increased current. To positively achieve the effects of reducing the operating voltage and increasing the current, however, a thick porous layer having a thickness of several hundreds of nanometers should be formed on the surface of the cathode. Specifically, in the case where a porous layer having a thickness of 470 nm is formed on the surface, there has been observed the effect of increasing the current which is five to ten times as large as the current flowing in the case where no porous layer is formed.

However, the formation of a thick porous layer having a thickness of several hundreds of nanometers on the surface of the cathode degrades the configuration of the tip portion of the cathode. Although the critical requirements placed on the performance of the field-effect electron source for the practical applications thereof includes uniform electron emission and stable device characteristics in addition to a reduced operating voltage and an increased current, the radius of curvature of the tip portion of the cathode varies in the field-emission electron source according to the third conventional embodiment, which in turn causes the problems of non-uniform electron emission and unstable device characteristics.

SUMMARY OF THE INVENTION

In view of the foregoing, a first object of the present invention is to prevent the lowering of the maximum value of a current that can be allowed to flow through a minimized tower-shaped cathode. A second object of the present invention is to ensure positive emission of electrons and reduce variations in the characteristics of the operating voltage during electron emission even when slight variations are observed in the configurations of the tip portions of the cathodes. A third object of the present invention is to provide uniform electron emission and stable device characteristics even when the electron emitting property of the cathode is greatly improved by increasing the number of emitting sites in the cathode.

To attain the above first object, a first field-emission electron source according to the present invention comprises: a substrate; a withdrawn electrode formed on the substrate with an insulating film interposed therebetween and having an opening corresponding to a region in which a cathode is to be formed; a tower-shaped cathode formed on the substrate and in the opening of the withdrawn electrode; and a surface coating layer made of a material having a low work function and formed indiscreetly over a surface of the cathode and a surface of a portion of the substrate exposed in the opening of the withdrawn electrode.

In the first field-emission electron source, the surface coating layer made of the material having a low work function is formed indiscreetly over the surfaces of the cathode and of the portion of the substrate exposed in the opening of the withdrawn electrode, so that a maximum permissible current value determined by the substrate resistance and the area of the cross section of the tower-shaped cathode is increased. As a result, even if the tower-shaped cathode is miniaturized, there can be prevented the phenomenon of the current flowing intensively to the bottom portion of the cathode and hence the generation of Joule heat. Consequently, there is no risk that the melted cathode destroys the whole device even when the cathode is driven with a larger current.

In the first field-emission electron source, the material having a low work function preferably contains at least one of a metal material having a high melting point composed of Cr, Mo, Nb, Ta, Ti, W, or Zr, a carbide of the metal material having a high melting point, a nitride of the metal having a high melting point, and a silicide of the metal having a high melting point.

Since the material typically used in a silicon semiconductor process and having a high reactivity with the silicon substrate is used as the material having a low work function, the surface coating film can be formed uniformly with high productivity so that the resulting device has higher performance. Moreover, the combination of the silicon substrate and the material having a low work function is highly compatible with a normal silicon semiconductor process and hence is industrially useful.

To attain the second object, a second field-emission electron source according to the present invention comprises: a substrate; a withdrawn electrode formed on the substrate with an insulating film interposed therebetween and having an opening corresponding to a region in which a cathode is to be formed; a cathode formed on the substrate and in the opening of the withdrawn electrode; and a high-concentration impurity layer formed in a surface region of the cathode and containing an impurity at a concentration higher than the impurity concentration of the substrate.

In the second field-emission electron source, the high-concentration impurity layer is formed in the surface region of the cathode, so that electrons are positively emitted from the surface region of the cathode, resulting in lower power consumption of the resulting device.

In the second field-emission electron source, the cathode preferably has a tower-like configuration and the high-concentration impurity layer is formed indiscreetly in the surface region of the cathode and in a surface region of a portion of the substrate exposed in the opening of the withdrawn electrode.

In the arrangement, a maximum permissible current value determined by the substrate resistance and the area of the cross section of the tower-shaped cathode are increased. As a result, even if the tower-shaped cathode is miniaturized, there can be prevented the phenomenon of the current flowing intensively to the bottom portion of the cathode and hence the generation of Joule heat. Consequently, there is no risk that the melted cathode destroys the whole device even when the cathode is driven with a larger current.

In the second field-emission electron source, the high-concentration impurity layer preferably has a sheet resistivity of 10 kΩ or less. The arrangement remarkably improves the electron emitting property and thereby greatly reduces the power consumption of the resulting device.

To attain the third object, a third field-emission electron source according to the present invention comprises: a substrate; a withdrawn electrode formed on the substrate with an insulating film interposed therebetween and having an opening corresponding to a region in which a cathode is to be formed; a cathode formed on the substrate and in the opening of the withdrawn electrode; and a surface coating layer composed of an ultra-fine particulate structure and formed over a surface of the cathode.

In the third field-emission electron source, the surface coating layer composed of the ultra-fine particulate structure formed on the surface of the cathode has greatly increased the number of electron emitting sites. As a result, a current and a voltage applied to the withdrawn electrode to obtain a specific quantity of electrons can be reduced significantly, resulting in lower power consumption and a more stable current flowing during electron emission.

The surface coating layer formed on the surface of the cathode also prevents the tip portion of the cathode from having an obtuse configuration, so that the radius of curvature of the tip portion is not increased nor varied. Consequently, the device characteristics do not vary, which facilitates device design flexibility and reliability.

Although the emitted current tends to be unstable due to the electron emitting sites susceptible to the adsorbing action of the molecules of a residual gas in vacuum, variations in the quantity of emitted electrons are eliminated by the averaging effect of numerous minute particles, so that an extremely stable electron emitting property is obtained, while a drastic increase in the quantity of emitted electrons is suppressed. Hence, the problem of the destroyed cathode resulting from an extraordinary increase in the quantity of emitted electrons is also solved.

In the third field-emission electron source, the ultra-fine particulate structure is preferably constituted by a group of uniform ultra-fine particles each having a diameter of 10 nm or less. The arrangement ensures an increase in the number of electron emitting sites and improves the electron emitting effect.

In the third field-emission electron source, the cathode preferably has a tower-like or cocktail-glass-like configuration. The configuration further increases the electrostatic focusing effect at the tip portion of the cathode, thereby greatly improving the electron emitting effect.

A first method of manufacturing a field-emission electron source according to the present invention comprises: a cathode forming step of etching a substrate by using an etching mask formed on the substrate to form a tower-shaped cathode on the substrate; a withdrawn-electrode forming step of successively forming an insulating film and a conductive film over the entire surface of the substrate and lifting off the insulating film and the conductive film overlying the etching mask to form a withdrawn electrode having an opening surrounding the cathode; and a surface-coating-layer forming step of forming a surface coating layer made of a material having a low work function over a surface of the cathode and a surface of a portion of the substrate exposed in the opening of the withdrawn electrode.

In accordance with the first method of manufacturing a field-emission electron source, the formation of the tower-shaped cathode and of the withdrawn electrode having an opening surrounding the cathode is followed by the formation of the surface coating layer made of the material having a low work function, so that the resulting surface coating layer surely and indiscreetly covers the surfaces of the cathode and of the portion of the substrate exposed in the opening of the withdrawn electrode. This enables simple and reproducible manufacturing of the first field-emission electron source.

In the first method of manufacturing a field-emission electron source, the surface-coating-layer forming step preferably includes the step of forming the surface coating layer by collimate sputtering to impart directivity to deposition.

Since collimate sputtering has an excellent depositing capability, the surface coating layer can positively be deposited even when the device is miniaturized and the diameter of the opening of the withdrawn electrode is reduced, resulting in improved reliability of the device.

A second method of manufacturing a field-emission electron source according to the present invention comprises: a cathode forming step of etching a substrate by using an etching mask formed on the substrate to form a cathode on the substrate; a withdrawn-electrode forming step of successively forming an insulating film and a conductive film over the entire surface of the substrate and lifting off the insulating film and the conductive film overlying the etching mask to form a withdrawn electrode having an opening surrounding the cathode; and a high-concentration-impurity-layer forming step of forming a high-concentration impurity layer containing an impurity at a concentration higher than the impurity concentration of the substrate.

In accordance with the second method of manufacturing a field-emission electron source, the formation of the cathode and of the withdrawn electrode having the opening surrounding the cathode is followed by the formation of the high-concentration impurity layer, so that the high-concentration impurity layer is formed selectively in the surface region of the cathode. Accordingly, the second field-emission electron source can be manufactured simply with high reproducibility.

In the second method of manufacturing a field-emission electron source, the high-concentration-impurity-layer forming step preferably includes the steps of: forming a deposit film containing an impurity element over a surface of the cathode; and forming the high-concentration impurity layer in a surface region of the cathode by causing solid phase diffusion of the impurity element contained in the deposit film into the surface region of the cathode.

When the impurity element contained in the film deposited on the surface of the cathode is diffused in the surface region of the cathode by solid phase diffusion using rapid thermal application in accordance with the second manufacturing method, the high-concentration impurity layer can be formed positively and selectively in the surface region of the cathode.

In the second method of manufacturing a field-emission electron source, the high-concentration-impurity-layer forming step preferably includes the step of forming the high-concentration impurity layer in a surface region of the cathode by introducing an impurity element into the surface region of the cathode by ion implantation.

By thus forming the high-concentration impurity layer in the surface region of the cathode by ion implantation for introducing the impurity element in the surface region of the cathode, the high-concentration impurity layer can be formed positively and selectively in the surface region of the cathode.

A third method of manufacturing a field-emission electron source according to the present invention comprises: a cathode forming step of etching a substrate by using an etching mask formed on the substrate to form a cathode on the substrate; a withdrawn-electrode forming step of successively forming an insulating film and a conductive film over the entire surface of the substrate and lifting off the insulating film and the conductive film overlying the etching mask to form a withdrawn electrode having an opening surrounding the cathode; and a surface-coating-layer forming step of forming a surface coating layer composed of an ultra-fine particulate structure over a surface of the cathode.

In accordance with the third method of manufacturing a field-emission electron source, the formation of the cathode and of the withdrawn electrode having the opening surrounding the cathode is followed by the formation of the surface coating layer composed of the ultra-fine particulate structure, so that the surface coating layer is formed selectively on the surface of the cathode. In this case, although the surface coating layer is also formed on the withdrawn electrode, it presents no particular problem since the withdrawn electrode formed for the application of a voltage permits no current flow. Hence, the third field-emission electron source can be manufactured simply with high reproducibility.

In a third method of manufacturing a field-emission electron source according to the present invention, the surface-coating-layer forming step preferably includes the step of forming the surface coating layer by vapor phase epitaxy.

In accordance with the third manufacturing method, the surface of the cathode has no possibility of suffering damage during the process, which is excellently uniform and reproducible. Consequently, it becomes possible to form an array of extremely small field-emission electron sources at a high density with high precision.

In this case, the vapor phase epitaxy is preferably laser ablation. Since laser ablation enables the formation of the surface coating layer with high energy, the ultra-fine particulate structure can positively be formed on the surface of the cathode.

DETAILED DESCRIPTION OF THE INVENTION

First Embodiment

Figure 1A:
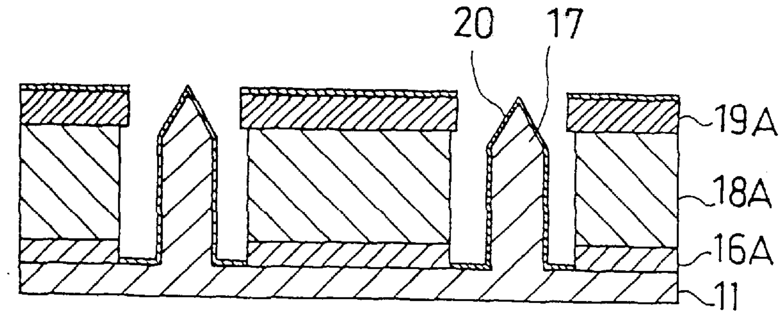
FIGS. 1(*a*) and 1(*b*) show a field-emission electron source according to a first embodiment of the present invention, of which FIG. 1(*a*) is a cross-sectional view taken along the line I—I of FIG. 1(*b*) and FIG. 1(*b*) is a plan view.
Figure 1B:
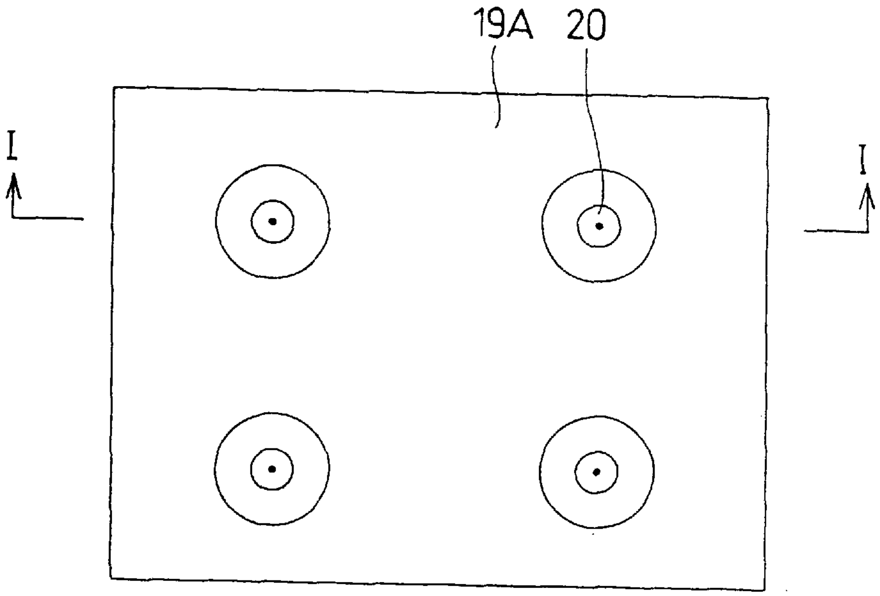

Referring now to FIGS. 1, the structure of a field-emission electron source according to a first embodiment of the invention will be described. FIG. 1(*a*) shows a cross-sectional structure of the electron source taken along the line I—I of FIG. 1(*b*) and FIG. 1(*b*) shows a plan structure thereof.

As shown in FIGS. 1(*a*) and 1(*b*), a withdrawn electrode 19A is formed on a silicon substrate 11 made of a silicon crystal with intervention of an insulating film consisting of an upper silicon oxide film 18A and a lower silicon oxide film 16A each having circular openings corresponding to respective regions in which cathodes are to be formed, which have been arranged to form an array. In this case, the diameter of the opening of the withdrawn electrode 19A is smaller than the diameters of the respective openings of the upper and lower silicon oxide films 18A and 16A so that the circumferential surfaces of the openings of the upper and lower silicon oxide films 18A and 16A are recessed relative to the circumferential surface of the opening of the withdrawn electrode 19A.

In the openings of the upper and lower silicon oxide films 18A and 16A and of the withdrawn electrode 19A, there are formed tower-shaped cathodes 17 which are circular in cross section. Each of the cathodes 17 has a sharply tapered tip portion with a radius of 2 nm or less, which has been formed by crystal anisotropic etching and thermal oxidation process for silicon.

The portion of the silicon substrate 11 exposed in the openings of the upper and lower silicon oxide films 18A and 16A and the surface of the cathode 17 are coated with a thin surface coating film 20 made of a high-work-function material composed of a high-melting-point metal material or of a compound material thereof. As the low-work-function material, a high-melting-point metal material such as Cr, No, Nb, Ta, Ti, W, or Zr or a compound material such as a carbide, nitride, or silicide of the high-melting-point material can be used appropriately. This improves the physical and chemical properties of the surface of the cathode 17. For example, if a TiN film is formed as the surface coating film 20 by sputtering on the surface of the cathode 17 to a thickness of about 10 nm, the sharply tapered configuration of the tip portion of the underlying cathode 17 is substantially reproduced so that the cathode 17 coated with the TiN film also sharply tapered is implemented. The work function of TiN is estimated to be about 2.9 eV, while the work function of silicon is about 4.8 eV, so that a considerable reduction has been achieved in the work function at the surface of the tip portion of the cathode 17. Accordingly, a starting voltage required for electron emission can be reduced significantly. Moreover, since the foregoing coating materials composing the surface coating film 20 are considered to have more stable chemical properties than the chemical properties of silicon, the use of the coating materials may also be effective in improving the stability of the current flowing during electron emission.

Furthermore, with the insulating film consisting of the upper and lower silicon oxide films 18A and 16A recessed relative to the withdrawn electrode 19A, insulation provided between the cathode 17 and the withdrawn electrode 19A is excellently maintained even when the surface coating film 20 is formed over the entire surface of the cathode 17 and therefore no short-circuit failure occurs. In an emitter array structure in which devices are integrated on a large scale, in particular, the recessed configuration is extremely effective in improving the production yield of the device and the reliability of the operation thereof.

A description will be given to a method of manufacturing the field-emission electron source according to the first embodiment with reference to FIGS. 7 to 9.

First, as shown in FIG. 7(*a*), the first silicon oxide film 12 is formed by thermal oxidation on the (100) crystal plane of the silicon substrate 11 made of a silicon crystal, followed by the deposition of a photoresist film 13 on the first silicon oxide film 12.

Next, as shown in FIG. 7(*b*), the photoresist film 13 is subjected to photolithography for forming disk-shaped resist masks 13A each having a diameter of about 0.5 $\mu$m. Subsequently, anisotropic dry etching is performed with respect to the first silicon dioxide film 12 by using the resist masks 13A, thereby transferring the pattern of the resist masks 13A to the first silicon dioxide film 12 and forming silicon oxide masks 12A therefrom.

Next, as shown in FIG. 7(*c*), the removal of the resist mask 13A is followed by anisotropic etching performed with respect to the silicon substrate 11 by using the silicon oxide masks 12A, whereby cylindrical elements 14A are formed on the surface of the silicon substrate 11.

Next, as shown in FIG. 7(*d*), wet etching is performed with respect to the cylindrical elements 14A by using an etching agent having crystal anisotropy, such as an aqueous solution of ethylenediamine and pyrocatechol, thereby forming hourglass elements 14B each having a side surface including the (331) crystal plane and constricted in the middle. In this case, the diameter of the silicon oxide mask 12A and the degree of constriction of the hourglass element 14B are optimumly determined so that the microstructured hourglass elements 14B each having the constricted portion with a diameter of about 0.1 $\mu$m are formed uniformly with high reproducibility.

Next, as shown in FIG. 8(*a*), second silicon oxide films 15 each having a reduced thickness of about 10 nm are formed on the sidewalls of the hourglass elements 14B by thermal oxidation to protect the constricted portions of the hourglass elements 14B. Thereafter, anisotropic dry etching is performed with respect to the silicon substrate 11 by using again the silicon oxide masks 12A to vertically etch the silicon substrate 11, thereby forming cylindrical elements 14C with respective hourglass heads on the surface of the silicon substrate 11, as shown in FIG. 8(*b*).

Next, as shown in FIG. 8(*c*), a third silicon oxide film 16 having a thickness of about 100 nm is formed by thermal oxidation over the surfaces of the cylindrical elements 14C with respective hourglass heads and of the silicon substrate 11, thereby forming cathodes 17 inside the cylindrical elements 14C with respective hourglass heads. The third silicon oxide film 16 thus formed over the surfaces of the cylindrical elements 14C with respective hourglass heads is for sharply tapering the tip portions of the cathodes 17 and enhancing the insulating property of an insulating film underlying the withdrawn electrode, which will be described later. In this case, if thermal oxidation is performed at a temperature of about 950° C., which is lower than the melting point of silicon oxide, a stress develops in the vicinity of the interface between the cathode 17 made of silicon and the third silicon oxide film 16 during thermal oxidation, so that the resulting cathode 17 has a tip portion sharply tapered. Moreover, the silicon oxide film formed by thermal oxidation is superior in film quality to a silicon oxide film formed by another method such as vapor deposition, so that it has high insulation resistance. As a result, there can be formed a highly reliable device exhibiting an excellent insulating property during the application of a voltage to the withdrawn electrode, which will be described later.

Next, as shown in FIG. 8(*d*), a fourth silicon oxide film 18 used as an insulating film and a conductive film 19 used as the withdrawn electrode are successively deposited by vacuum vapor deposition with the silicon oxide masks 12A interposed therebetween. During the formation of the fourth silicon oxide film 18 by vacuum vapor deposition, ozone gas is introduced so as to form a high-quality silicon oxide film excellent in insulating property. The use of a Nb metal film as the conductive film 19 enables the formation of a uniform withdrawn electrode during a lift-off process, which will be described later.

Figure 9A:
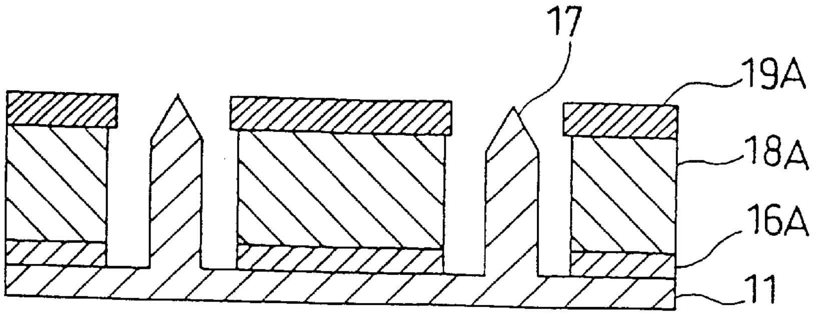
FIGS. 9(*a*) and 9(*b*) are cross-sectional views illustrating individual process steps in the method of manufacturing the field-emission electron source according to the first embodiment.
Figure 9B:
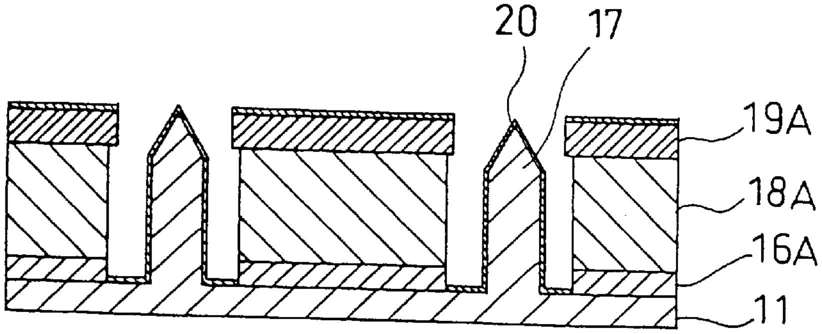
Figure 10A:
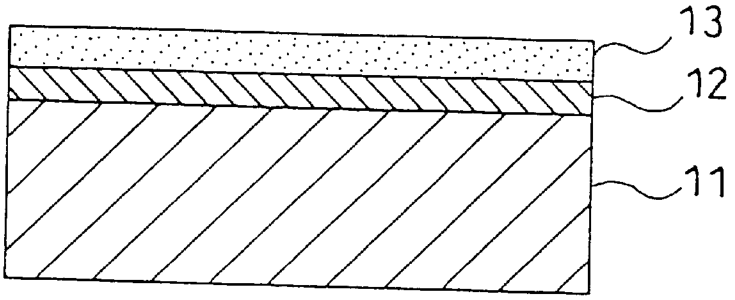
FIGS. 10(*a*) to 10(*d*) are cross-sectional views illustrating individual process steps in a method of manufacturing the field-emission electron source according to the second embodiment.
Figure 10B:
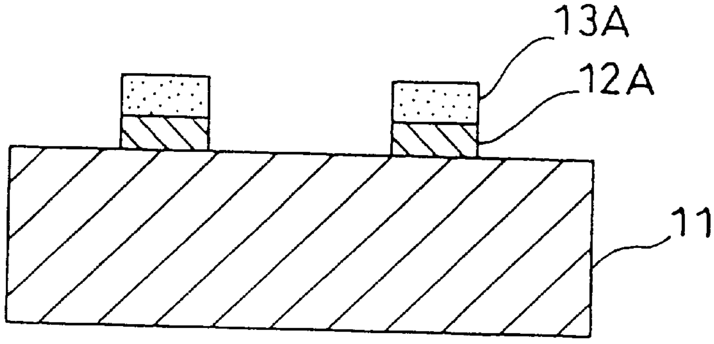
Figure 10C:
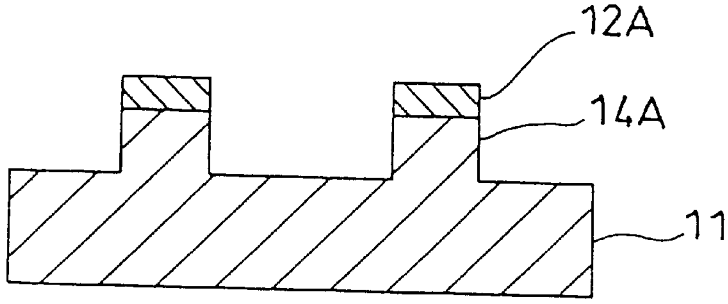
Figure 10D:
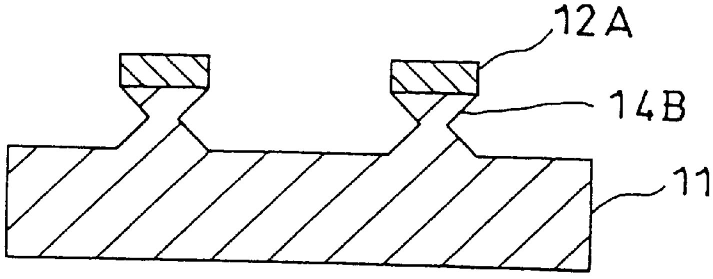
Figure 11A:
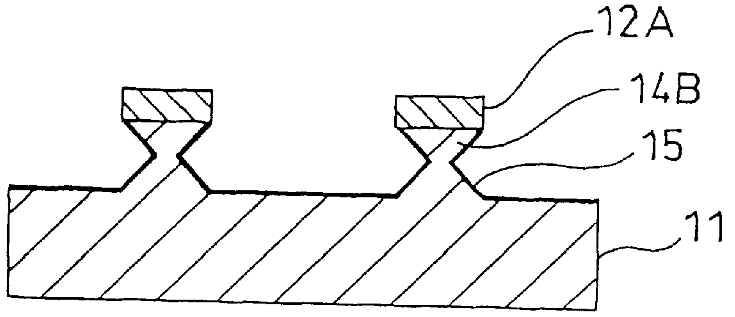
FIGS. 11(*a*) to 11(*d*) are cross-sectional views illustrating individual process steps in the method of manufacturing the field-emission electron source according to the second embodiment.
Figure 11B:
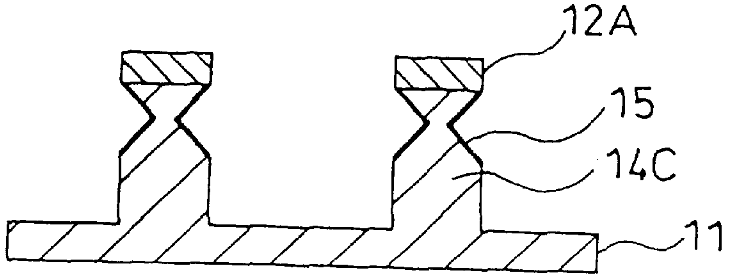
Figure 11C:
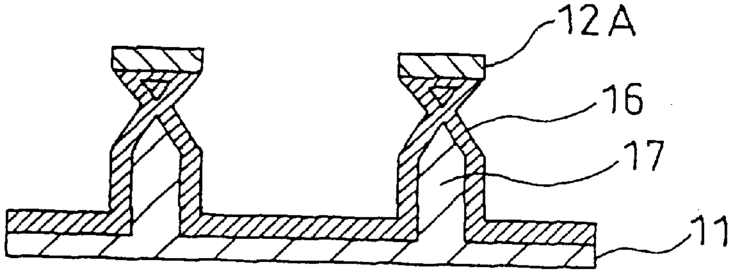
Figure 11D:
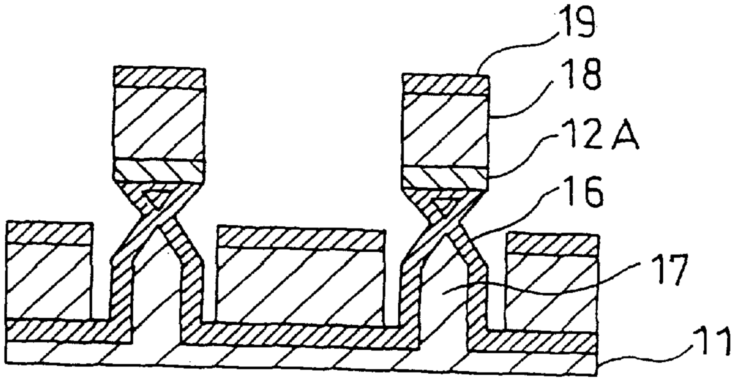

Next, as shown in FIG. 9(*a*), wet etching is performed by using a buffered hydrofluoric acid in an ultrasonic atmosphere to selectively remove the sidewall portions of the cathodes 17 and the silicon oxide masks 12A, thereby lifting off the conductive film 19 deposited on the silicon oxide masks 12A, while exposing the withdrawn electrode 19A having small openings and the cathodes 17. In this case, the duration of wet etching is controlled such that the third and fourth silicon oxide films 16 and 18 are overetched. In this manner, the circumferential surfaces of the openings of the upper and lower silicon oxide films 18 and 16 are recessed relative to the circumferential surface of the opening of the withdrawn electrode 19A.

Next, as shown in FIG. 9(*b*), surface coating films 20 made of a coating material composed of a metal material having a low work function or a compound material of the metal material is formed all over by sputtering, resulting in the field-emission electron source according to the first embodiment.

By thus using sputtering, surface coating films 20 excellent in coating property can be formed on the cathodes 17 even when a coating material composed of a high-melting-point metal material or a compound material thereof is used.

By adjusting the thicknesses of the surface coating films 20 to be 10 nm or less, there can be obtained a surface configuration faithfully reflecting the structures of the underlying cathodes 17. As a result, cathodes 17 each having a microstructured tip portion on the order of nanometers can be obtained even after the formation of the surface coating films 20.

Even when the openings of the withdrawn electrode 19A are extremely small, collimate sputtering used to form the surface coating films 20 imparts excellent directivity to deposition so that the surface coating films 20 are formed uniformly not only on the surfaces of the cathodes 17 but also on the bottom portions of the silicon substrate 11 exposed in the openings of the withdrawn electrode 19A. Consequently, it becomes possible to apply the surface coating process to a microstructured device having the prospect of operating at a lower voltage, which is advantageous in enhancing the performance of the device.

The foregoing manufacturing method also offers the advantage of excellently uniform and reproducible process and enables the formation of an extremely small field-emission electron source array at a high density with high precision.

Moreover, since the coating material composed of the high-melting-point metal material or a compound material thereof each having a low work function can be formed with high accuracy on the surfaces of the cathodes 17 made of silicon, the operating voltage for electron emission can be lowered to a value much lower than reached conventionally.

Second Embodiment

Figure 2A:
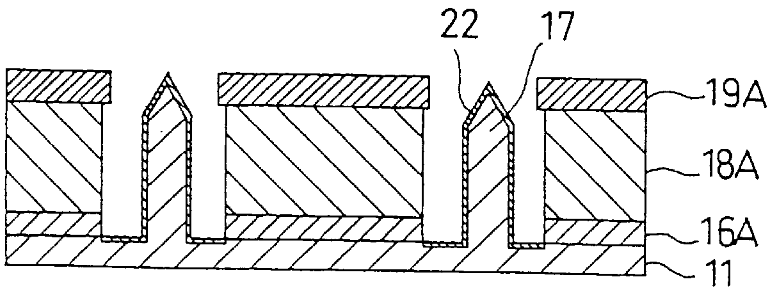
FIGS. 2(*a*) and 2(*b*) show a field-emission electron source according to a second embodiment of the present invention, of which FIG. 2(*a*) is a cross-sectional view taken along the line II—II of FIG. 2(*b*) and FIG. 2(*b*) is a plan view.
Figure 2B:
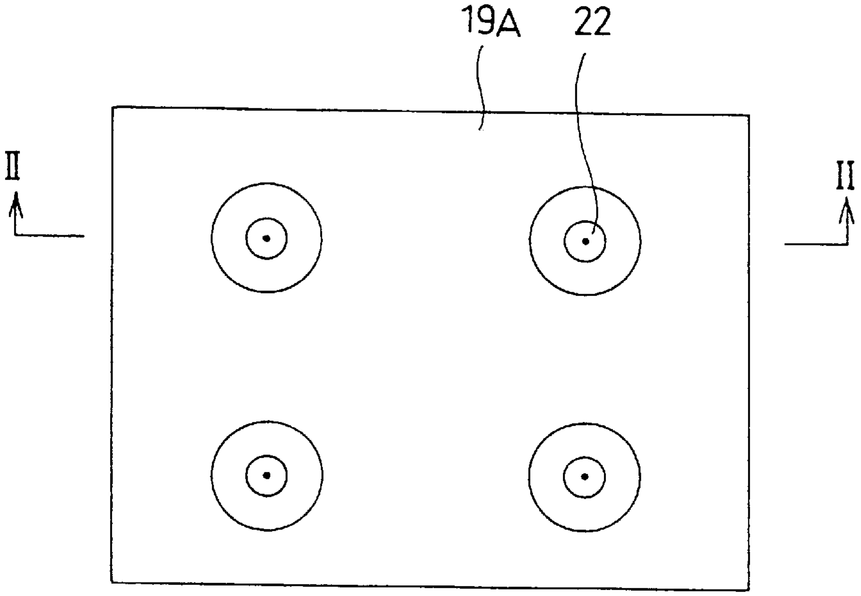

Referring to FIGS. 2, the structure of a field-emission electron source according to a second embodiment of the present invention will be described. FIG. 2(*a*) shows a cross-sectional structure taken along the line II—II of FIG. 2(*b*) and FIG. 2(*b*) shows a plan structure.

As shown in FIGS. 2(*a*) and 2(*b*), a withdrawn electrode 19A is formed on a silicon substrate 11 made of a silicon crystal with intervention of an insulating film consisting of an upper silicon oxide film 18A and a lower silicon oxide film 16A each having circular openings corresponding to respective regions in which cathodes are to be formed, which have been arranged to form an array. In this case, the diameter of the opening of the withdrawn electrode 19A is smaller than the diameters of the respective openings of the upper and lower silicon oxide films 18A and 16A so that the circumferential surfaces of the respective openings of the upper and lower silicon oxide films 18A and 16A are recessed relative to the circumferential surface of the opening of the withdrawn electrode 19A.

In the openings of the upper and lower silicon oxide films 18A and 16A and of the withdrawn electrode 19A, there are formed tower-shaped cathodes 17 which are circular in cross section. Each of the cathodes 17 has a sharply tapered tip portion with a radius of 2 nm or less, which has been formed by crystal anisotropic etching and thermal oxidation process for silicon.

In the surface regions of the portion of the silicon substrate 11 exposed in the openings of the upper and lower silicon oxide films 18A and 16A and of the cathode 17, there is formed a high-concentration impurity layer 22 having the same conductivity type as that of the silicon substrate 11 and containing an impurity at a concentration higher than the impurity concentration of the silicon substrate 11.

By using an n-type silicon substrate 11 and phosphorus as the impurity contained in the high-concentration impurity layer 21 and adjusting the sheet resistivity of the high-concentration impurity layer 21 to be 10 kΩ or less, the efficiency of electron emission at the tip portion of the cathode 17 can be increased significantly. Consequently, a starting voltage required to emit a specified quantity of electrons can be reduced significantly or the quantity of electrons that can be emitted at a specified starting voltage can be increased significantly.

A method of manufacturing the field-emission electron source according to the second embodiment will be described with reference to FIGS. 10 to 12.

First, as shown in FIG. 10(*a*), a first silicon oxide film 12 is formed by thermal oxidation on the (100) crystal plane of the silicon substrate 11 made of a silicon crystal, followed by the deposition of a photoresist film 13 on the first silicon oxide film 12.

Next, as shown in FIG. 10(*b*), the photoresist film 13 is subjected to photolithography for forming disk-shaped resist masks 13A each having a diameter of about 0.5 μm. Subsequently, anisotropic dry etching is performed with respect to the first silicon oxide film 12 by using the resist masks 13A, thereby transferring the pattern of the resist masks 13A to the first silicon oxide film 12 and forming silicon oxide masks 12A therefrom.

Next, as shown in FIG. 10(*c*), the removal of the resist masks 13A is followed by anisotropic dry etching performed with respect to the silicon substrate 11 by using the silicon oxide masks 12A, thereby forming cylindrical elements 14A on the surface of the silicon substrate 11.

Next, as shown in FIG. 10(*d*), wet etching is performed with respect to the cylindrical elements 14A by using an etching agent having crystal anisotropy, such as an aqueous solution of ethylene diamine and pyrocatechol, thereby forming hourglass elements 14B each having a side surface including the (331) crystal plane and constricted in the middle. In this case, the diameter of the silicon oxide mask 12A and the degree of constriction of the hourglass element 14B are optimumly determined so that the microstructured hourglass elements 14B each having the constricted portion with a diameter of about 0.1 μm are formed uniformly with high reproducibility.

Next, as shown in FIG. 11(*a*), second silicon oxide films 15 each having a reduced thickness of about 10 nm are formed on the sidewalls of the hourglass elements 14B by thermal oxidation to protect the constricted portions of the hourglass elements 14B. Thereafter, anisotropic dry etching is performed with respect to the silicon substrate 11 by using again the silicon oxide masks 12A to vertically etch the silicon substrate 11, thereby forming cylindrical elements 14C with respective hourglass heads on the surface of the silicon substrate 11, as shown in FIG. 11(*b*).

Next, as shown in FIG. 11(*c*), a third silicon oxide film 16 having a thickness of about 100 nm is formed by thermal oxidation over the surfaces of the cylindrical elements 14C with respective hourglass heads and of the silicon substrate 11, thereby forming cathodes 17 inside the cylindrical elements 14C with respective hourglass heads. The third silicon oxide film 16 thus formed on the surfaces of the hourglass elements 14C is for sharply tapering the tip portions of the cathodes 17 and enhancing the insulating property of an insulating film underlying the withdrawn electrode, which will be described later. In this case, if thermal oxidation is performed at a temperature of about 950° C., which is lower than the melting point of silicon oxide, a stress develops in the vicinity of the interface between the cathode 17 made of silicon and the third silicon oxide film 16 during thermal oxidation, so that the resulting cathode 17 has a tip portion sharply tapered. Moreover, the silicon oxide film formed by thermal oxidation is superior in film quality to a silicon oxide film formed by another method such as vapor deposition, so that it has high insulation resistance. As a result, there can be formed a highly reliable device exhibiting an excellent insulating property during the application of a voltage to the withdrawn electrode, which will be described later.

Next, as shown in FIG. 11(*d*), a fourth silicon oxide film 18 used as an insulating film and a conductive film 19 used as the withdrawn electrode are successively deposited by vacuum vapor deposition with the silicon oxide masks 12A interposed therebetween. During the formation of the fourth silicon oxide film 18 by vacuum vapor deposition, ozone gas is introduced so as to form a high-quality silicon oxide film excellent in insulating property. The use of a Nb metal film as the conductive film 19 enables the formation of a uniform withdrawn electrode during a lift-off process, which will be described later.

Figure 12A:
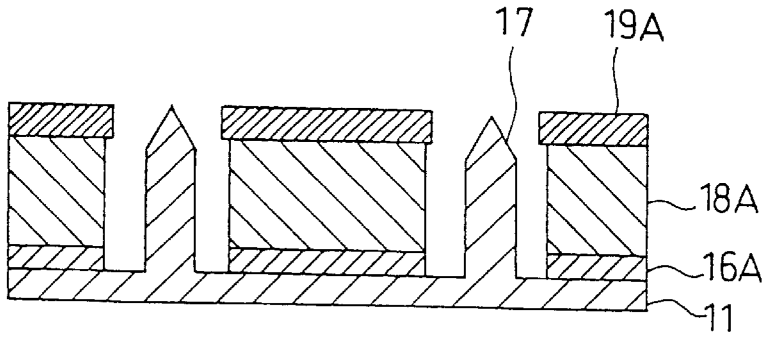
FIGS. 12(*a*) to 12(*c*) are cross-sectional views illustrating individual process steps in the method of manufacturing the field-emission electron source according to the second embodiment.
Figure 12B:
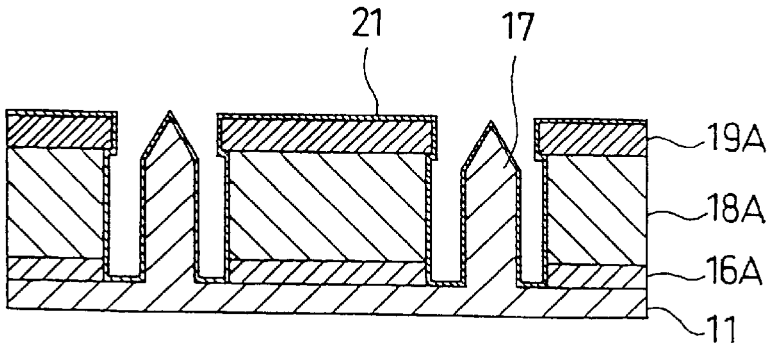
Figure 12C:
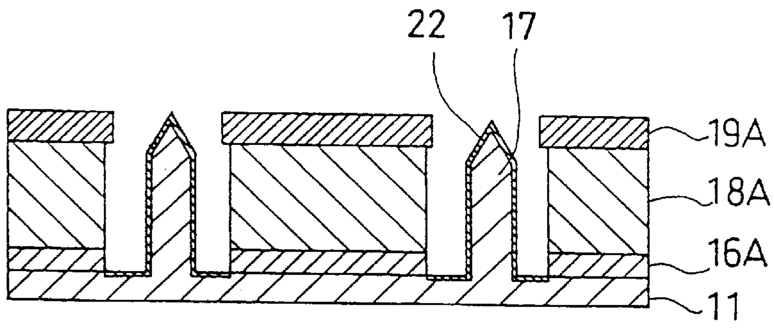
Figure 13A:
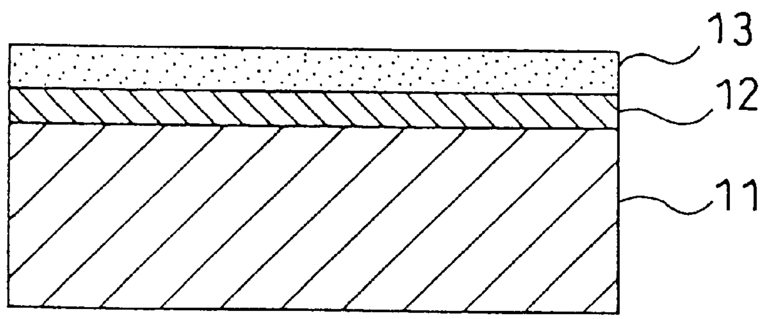
FIGS. 13(*a*) to 13(*d*) are cross-sectional views illustrating individual process steps in a method of manufacturing the field-emission electron source according to the fifth embodiment.
Figure 13B:
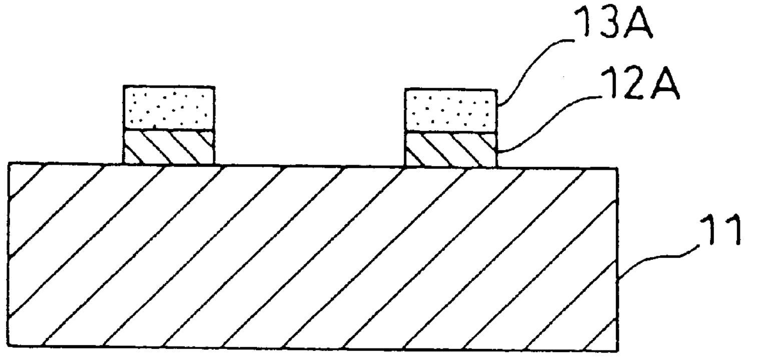
Figure 13C:
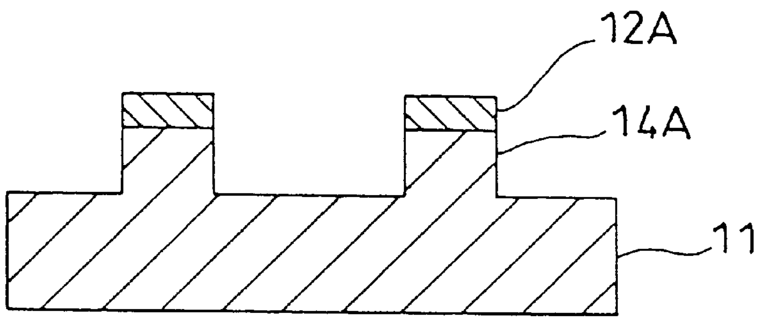
Figure 13D:
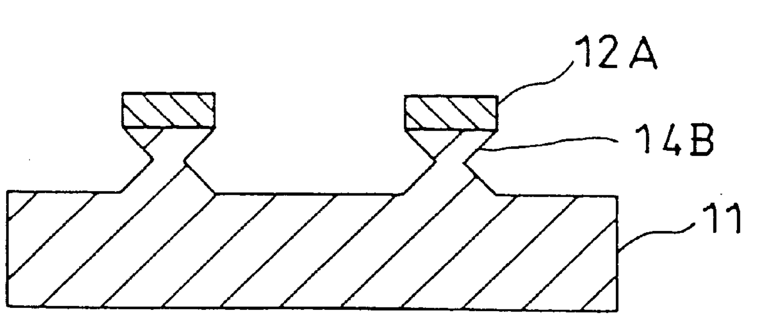
Figure 14A:
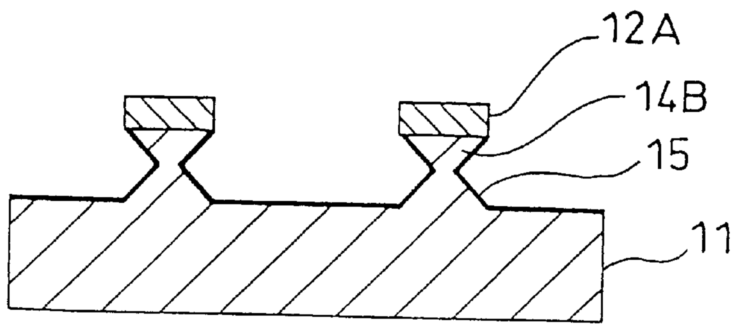
FIGS. 14(*a*) to 14(*d*) are cross-sectional views illustrating individual process steps in the method of manufacturing the field-emission electron source according to the fifth embodiment.
Figure 14B:
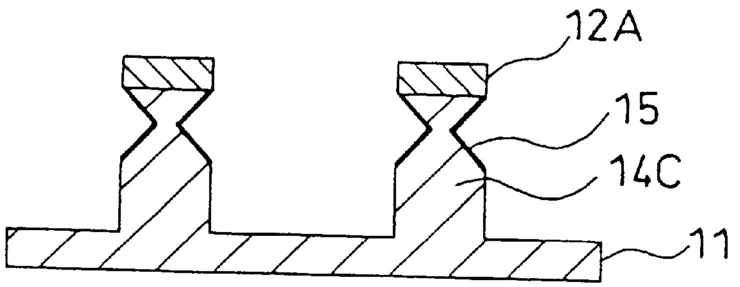
Figure 14C:
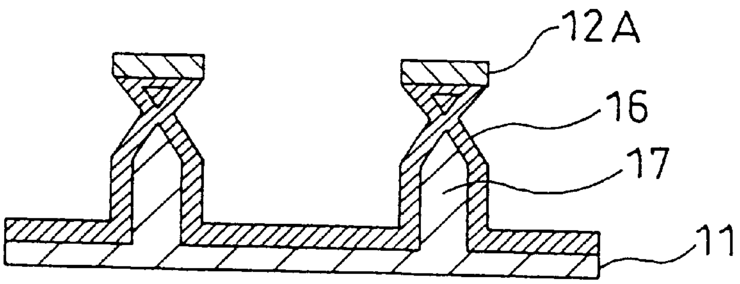
Figure 14D:
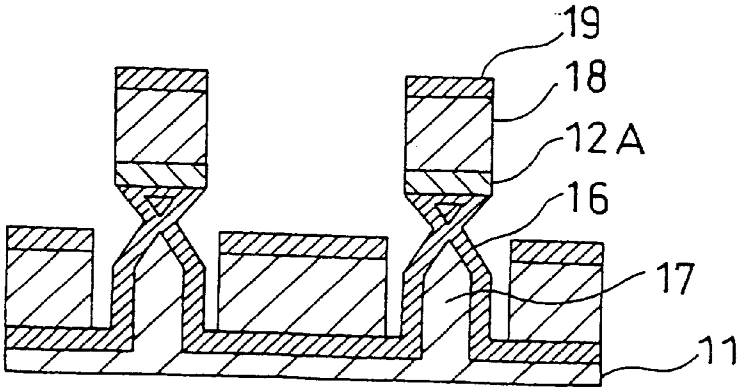

Next, as shown in FIG. 12(*a*), wet etching is performed by using a buffered hydrofluoric acid in an ultrasonic atmosphere to selectively remove the sidewall portions of the cathodes 17 and the silicon oxide masks 12A, thereby lifting off the conductive film 19 deposited on the silicon oxide masks 12A, while exposing the withdrawn electrode 19A having small openings and the cathodes 17. In this case, the duration of wet etching is controlled such that the third and fourth silicon oxide films 16 and 18 are overetched. In this manner, the circumferential surfaces of the openings of the upper and lower silicon oxide film 18A and 16A are recessed relative to the circumferential surface of the opening of the withdrawn electrode 19A.

Next, as shown in FIG. 12(*b*), a glass layer containing an impurity element at a high concentration, such as a phosphorus glass layer 21, is deposited over the entire surface of the silicon substrate 11 including the cathodes 17, followed by rapid thermal application (RTA) for performing a proper thermal treatment with respect to the phosphorus glass layer 21. The thermal treatment causes solid phase diffusion of the impurity element contained in the phosphorus glass layer 21 into the surface region of the cathodes 17, so that the high-concentration impurity layer 22 is formed in the surface regions of the cathodes 17, as shown in FIG. 12(*c*). In this manner, the high-concentration impurity layer 22 having a sheet resistivity of 10 kΩ or less is formed uniformly at a depth on the order of several tens of nanometers from the surface of the cathode 17. Thereafter, the phosphorus glass layer 21 is removed, resulting in the field-emission electron source according to the second embodiment.

Although the manufacturing method of the second embodiment has formed the high-concentration impurity layer 22 by solid phase diffusion using the phosphorus glass layer 21, the high-concentration impurity layer 22 may also be formed otherwise by introducing the impurity element into the surface of the cathode 17 by ion implantation with low energy and activating the impurity element by a thermal treatment. In this case, the high-concentration impurity layer 22 having a depth on the order of several tens of nanometers can be formed uniformly in the surface region of the cathode 17 by introducing phosphorus as the impurity element by ion implantation with acceleration energy of, e.g., 5 keV.

Thus, according to the method of manufacturing the field-emission electron source of the second embodiment, the high-concentration impurity layer 22 can be formed uniformly in the surface region of the cathode 17 with high productivity. Since the impurity concentration may be increased at the tip portion of the cathode 17, the efficiency of electron emission is remarkably improved, which achieves a significant reduction in starting voltage required to emit a specified quantity of electrons or a significant increase in the quantity of emitted electrons at a specified starting voltage.

Although the methods of manufacturing the field-emission electron sources according to the first and second embodiments have used crystal anisotropic etching and thermal oxidation process to form the cathodes 17 and the withdrawn electrode 19A on the (100) crystal plane of the silicon substrate 11 made of a silicon crystal and thereby implemented the sharply tapered tip portions of the cathodes 17, it is also possible to alternatively adopt a method in which a polysilicon film is formed at low temperature on a glass substrate and a thermal treatment, such as laser annealing, is performed with respect to prescribed regions of the polysilicon film in which the field-emission electron sources are to be formed, thereby crystallizing the polysilicon film in the prescribed regions. The method enables the formation of an array of field-emission electron sources occupying a large area on the low-cost glass substrate.

Instead of the silicon substrate 11 used in the first or second embodiment, a substrate made of another semiconductor material such as a compound semiconductor of GaAs or the like may be used.

Although the first and second embodiments have used the tower-shaped cathode 17 and the withdrawn electrode 19 having circular openings, the configurations of the cathode 17 and of the withdrawn electrode 19 are not limited thereto. A description will be given to an embodiment using a cathode 17 having a configuration different from the configuration used in the first and second embodiments.

Third Embodiment

Figure 3A:
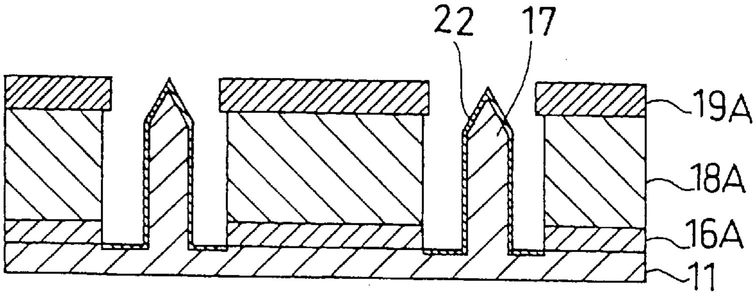
FIGS. 3(*a*) and 3(*b*) show a field-emission electron source according to a third embodiment of the present invention, of which FIG. 3(*a*) is a cross-sectional view taken along the line III—III of FIG. 3(*b*) and FIG. 3(*b*) is a plan view.
Figure 3B:
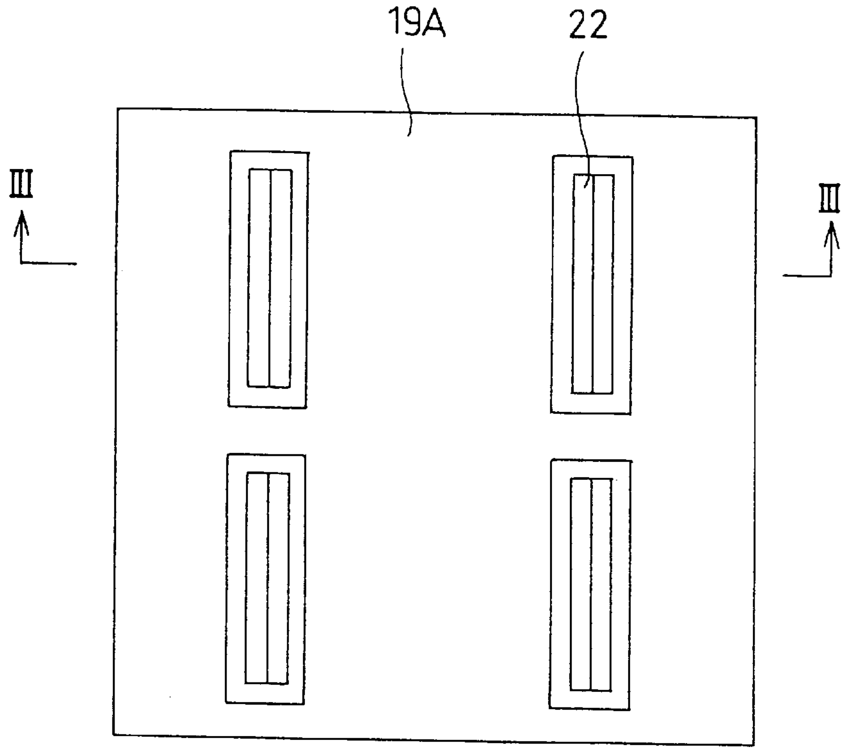

Referring to FIGS. 3, the structure of a field-emission electron source according to a third embodiment of the present invention will be described. FIG. 3(*a*) shows a cross-sectional structure taken along the line III—III of FIG. 3(*b*) and FIG. 3(*b*) shows a plan structure.

As shown in FIGS. 3(*a*) and 3(*b*), a withdrawn electrode 19A is formed on a silicon substrate 11 made of a silicon crystal with intervention of an insulating film consisting of an upper silicon oxide film 18A and a lower silicon oxide film 16A each having openings corresponding to respective rectangular regions in which cathodes are to be formed, which have been arranged to form an array. In this case, the length of each side of the openings of the withdrawn electrode 19A is smaller than the length of each corresponding side of the openings of the upper and lower silicon oxide films 18A and 16A so that the circumferential surfaces of the respective openings of the upper and lower silicon oxide films 18A and 16A are recessed relative to the circumferential surface of the opening of the withdrawn electrode 19A.

In the openings of the upper and lower silicon oxide films 18A and 16A and of the withdrawn electrode 19A, there are formed cathodes 18 of wedged structure.

In the surface regions of the portion of the silicon substrate 11 exposed in the respective openings of the upper and lower silicon oxide films 18A and 16A and of the cathode 17, there is formed a high-concentration impurity layer 22 having the same conductivity type as that of the silicon substrate 11 and containing an impurity at a concentration higher than the impurity concentration of the silicon substrate 11.

Fourth Embodiment

Figure 4A:
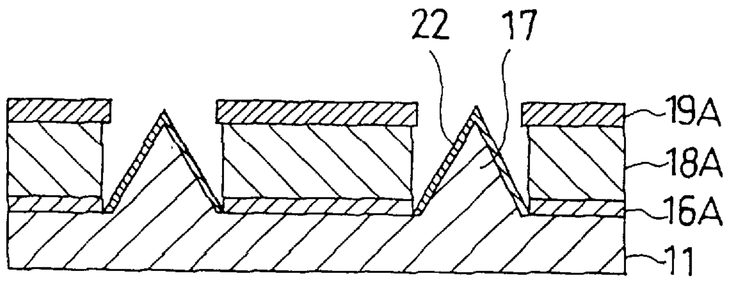
FIGS. 4(*a*) and 4(*b*) show a field-emission electron source according to a fourth embodiment of the present invention, of which FIG. 4(*a*) is a cross-sectional view taken along the line IV—IV of FIG. 4(*b*) and FIG. 4(*b*) is a plan view.
Figure 4B:
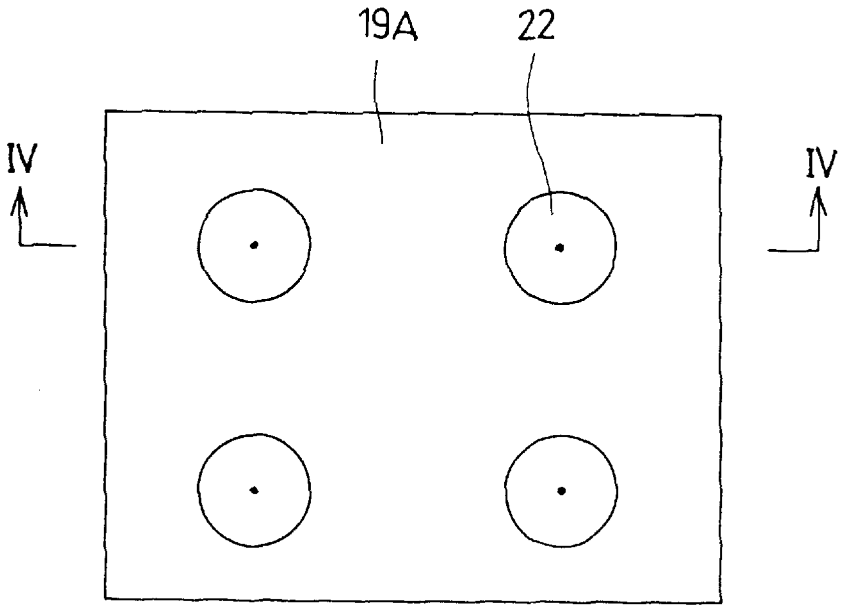

Referring to FIGS. 4, the structure of a field-emission electron source according to a fourth embodiment of the present invention will be described. FIG. 4(*a*) shows a cross-sectional structure taken along the line IV—IV of FIG. 4(*b*) and FIG. 4(*b*) shows a plan structure.

As shown in FIGS. 4(*a*) and 4(*b*), a withdrawn electrode 19A is formed on a silicon substrate 11 made of a silicon crystal with intervention of an insulating film consisting of upper and lower silicon oxide films 18A and 16A each having openings corresponding to respective circular regions in which cathodes are to be formed, which have been arranged to form an array. In this case, the diameter of the opening of the withdrawn electrode 19A is smaller than the diameters of the respective openings of the upper and lower silicon oxide films 18A and 16A so that the circumferential surfaces of the openings of the upper and lower silicon oxide films 18A and 16A are recessed relative to the circumferential surface of the opening of the withdrawn electrode 19A.

In the openings of the upper and lower silicon oxide films 18A and 16A and of the withdrawn electrode 19A, there are formed conical cathodes 17.

In the surface regions of the portion of the silicon substrate 11 exposed in the openings of the upper and lower silicon oxide films 18A and 16A and of the cathode 17, there is formed a shallow high-concentration impurity layer 22 having the same conductivity type as that of the silicon substrate 11 and containing an impurity at a concentration higher than the impurity concentration of the silicon substrate 11.

Fifth Embodiment

Figure 5A:
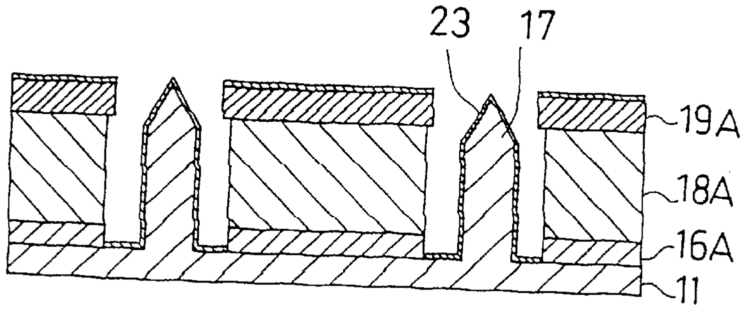
FIGS. 5(*a*) and 5(*b*) show a field-emission electron source according to a fifth embodiment of the present invention, of which FIG. 5(*a*) is a cross-sectional view taken along the line V—V of FIG. 5(*b*) and FIG. 5(*b*) is a plan view.
Figure 5B:
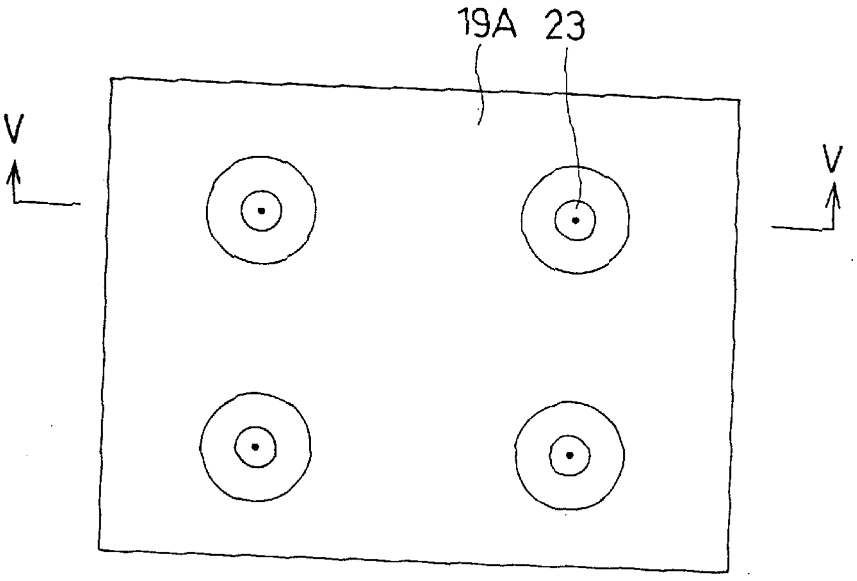

Referring to FIGS. 5, the structure of a field-emission electron source according to a fourth embodiment of the present invention will be described. FIG. 5(*a*) shows a cross-sectional structure taken along the line V—V of FIG. 5(*b*) and FIG. 5(*b*) shows a plan structure.

As shown in FIGS. 5(*a*) and 5(*b*), a withdrawn electrode 19A is formed on a silicon substrate 11 made of a silicon crystal via an insulating film consisting of upper and lower silicon oxide films 18A and 16A each having circular openings corresponding to regions in which cathodes are to be formed, which have been arranged to form an array. In this case, the diameter of the opening of the withdrawn electrode 19A is smaller than the diameters of the respective openings of the upper and lower silicon oxide films 18A and 16A so that the circumferential surfaces of the openings of the upper and lower silicon oxide films 18A and 16A are recessed relative to the circumferential surface of the opening of the withdrawn electrode 19A.

In the openings of the upper and lower silicon oxide films 18A and 16A and of the withdrawn electrode 19A, there are formed tower-shaped cathodes 17 which are circular in cross section. Each of the cathodes 17 has a sharply tapered tip portion with a radius of 2 nm or less, which has been formed by crystal anisotropic etching and thermal oxidation process for silicon.

The portion of the silicon substrate 11 exposed in the respective openings of the upper and lower silicon oxide films 18A and 16A and the cathode 17 have their surfaces coated with a surface coating layer 23 composed of an ultra-fine particulate structure formed by laser ablation. A material composing the surface coating layer 23 preferably has a low work function so that electrons are emitted positively. As ultra-fine particles composing the surface coating layer 23, silicon particles each having a diameter on the order of nanometers, i.e., a diameter of 10 nm or less are preferred in terms of the efficiency of electron emission. Preferably, the ultra-fine particles composing the surface coating layer 23 are deposited in a single or several layers. In the case where the silicon particle has a diameter of about 10 nm, a single layer of silicon particles is sufficient. In the case where the silicon particle has a diameter of about 5 nm, silicon particles are preferably deposited in two or three layers, as shown in FIG. 18(*a*).

Figure 18A:
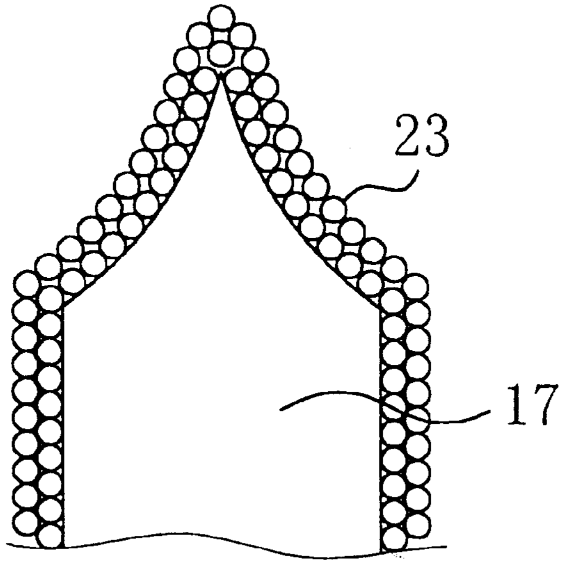
FIG. 18(*a*) diagrammatically shows the tip portion of a cathode in the field-emission electron source according to the fifth embodiment and FIG. 18(*b*) diagrammatically shows the tip portion of a cathode in the field-emission electron source according to the third embodiment.
Figure 18B:
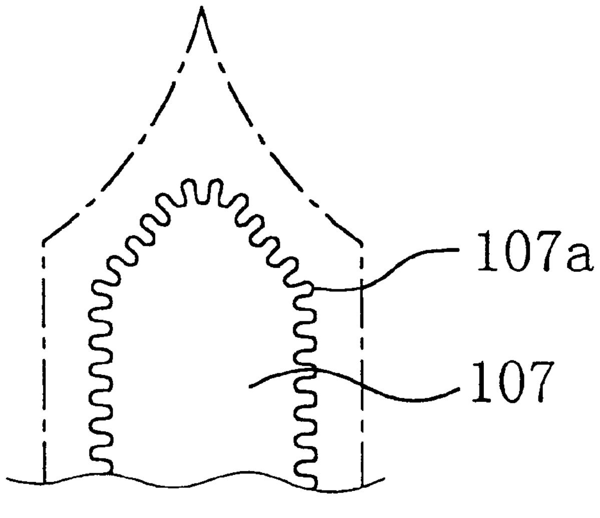
Fig. 18(b) Prior art
Figure 19A:
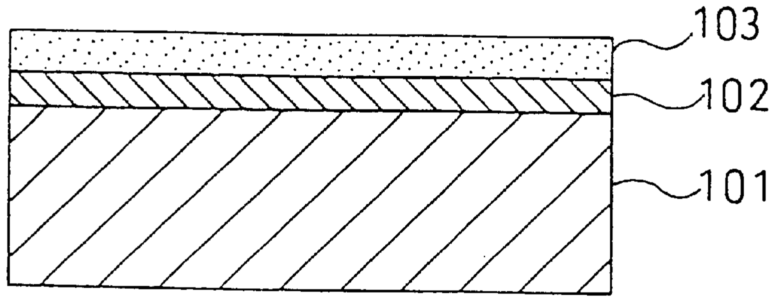
Fig. 19(a) Prior art
FIGS. 19(*a*) to 19(*d*) are cross-sectional views illustrating individual process steps in a method of manufacturing a field-emission electron source according to a first conventional embodiment.
Figure 19B:
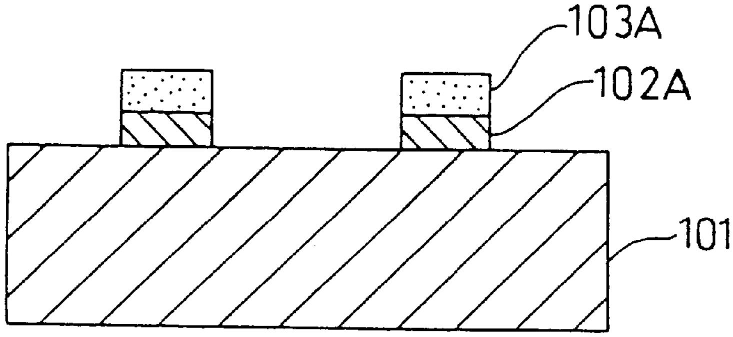
Fig. 19(b) Prior art
Figure 19C:
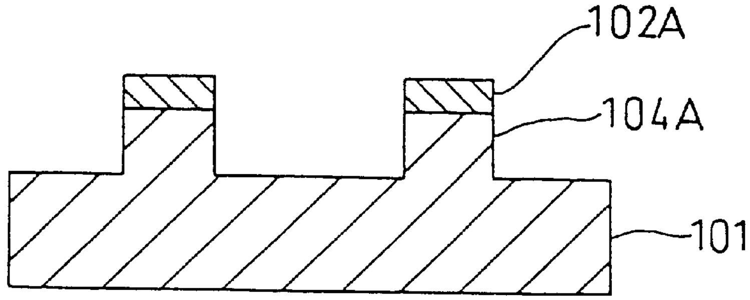
Fig. 19(c) Prior art
Figure 19D:
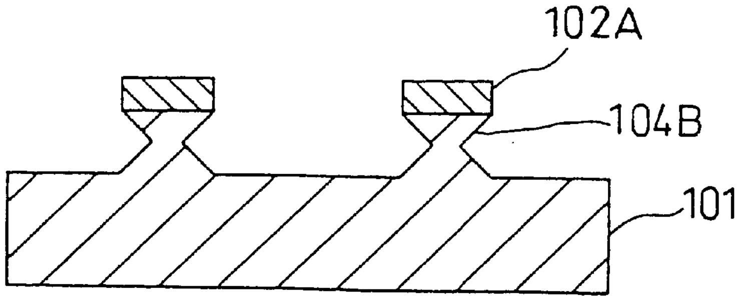
Fig. 19(d) Prior art
Figure 20:
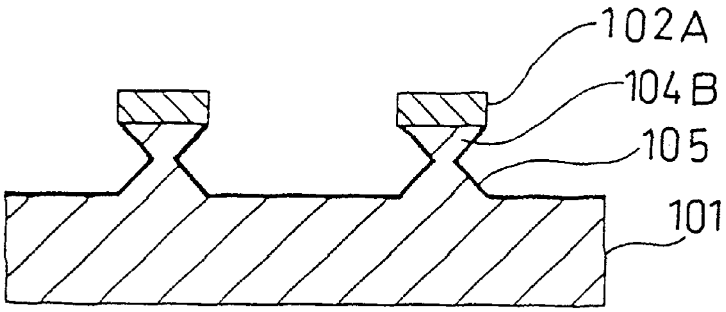
Fig. 20 (a) Prior art
FIGS. 20(*a*) to 20(*d*) are cross-sectional views illustrating individual process steps in the method of manufacturing the field-emission electron source according to the first conventional embodiment.
Figure 20:
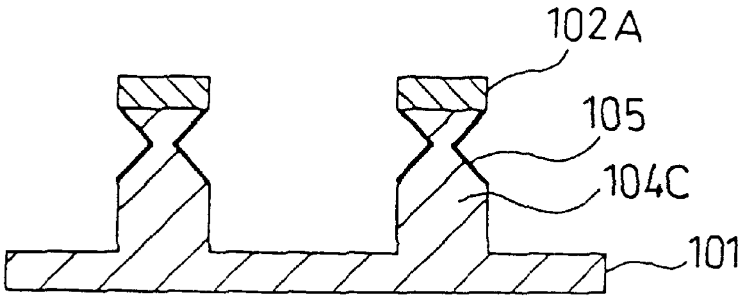
Fig. 20 (b) Prior art
Figure 20:
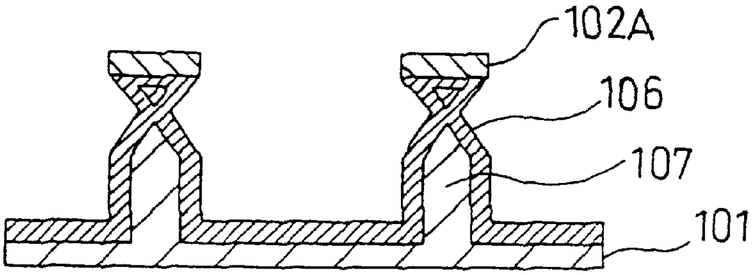
Fig. 20 (c) Prior art
Figure 20:
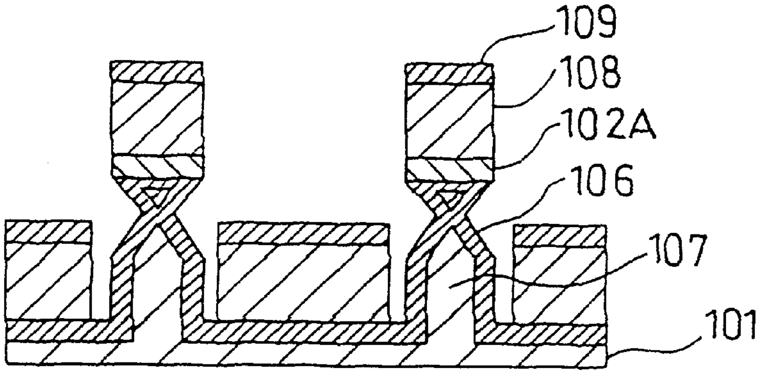
Fig. 20 (d) Prior art
Figure 21:
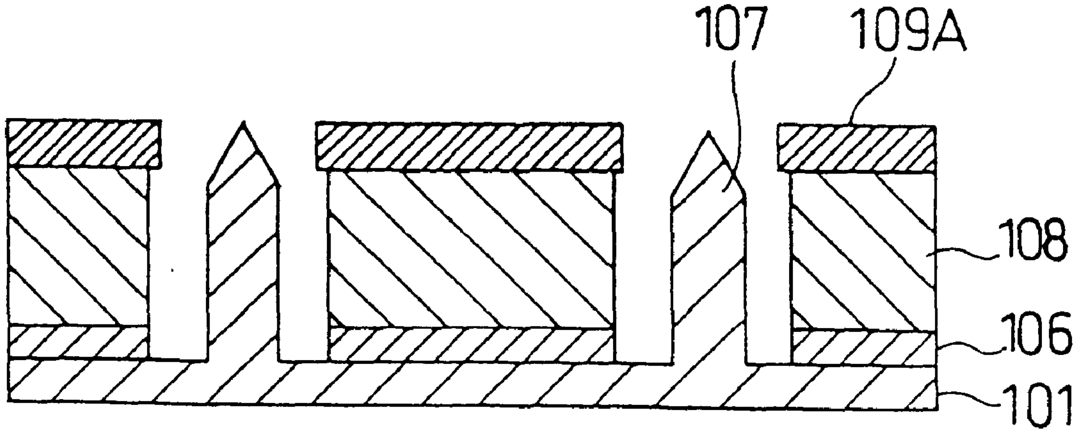
Fig. 21 Prior art
FIG. 21 is a cross-sectional view illustrating process steps in the method of manufacturing the field-emission electron source according to the first conventional embodiment.
Figure 22:
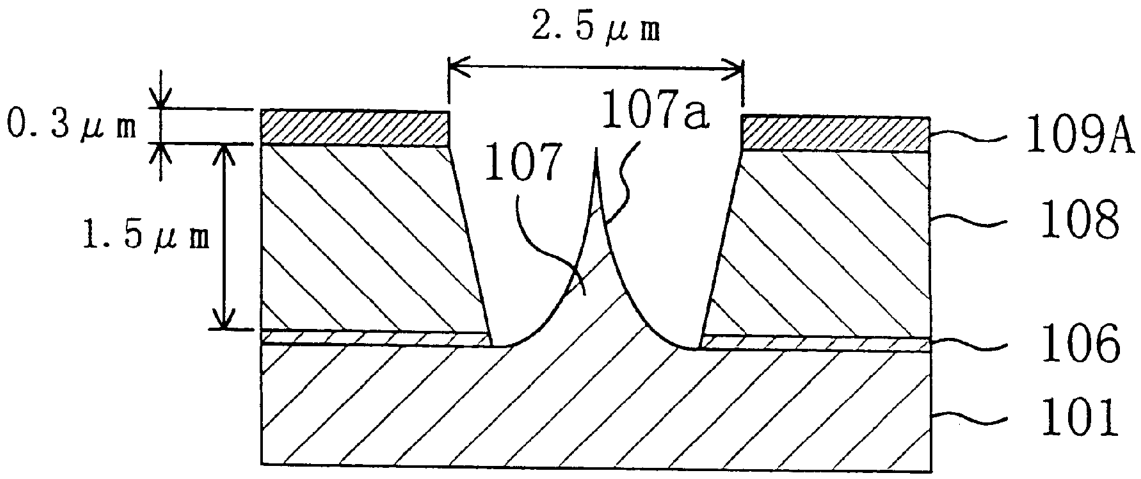
Fig. 22 Prior art
FIG. 22 is a cross-sectional view of a field-emission electron source according to a third conventional embodiment.
Figure 23:
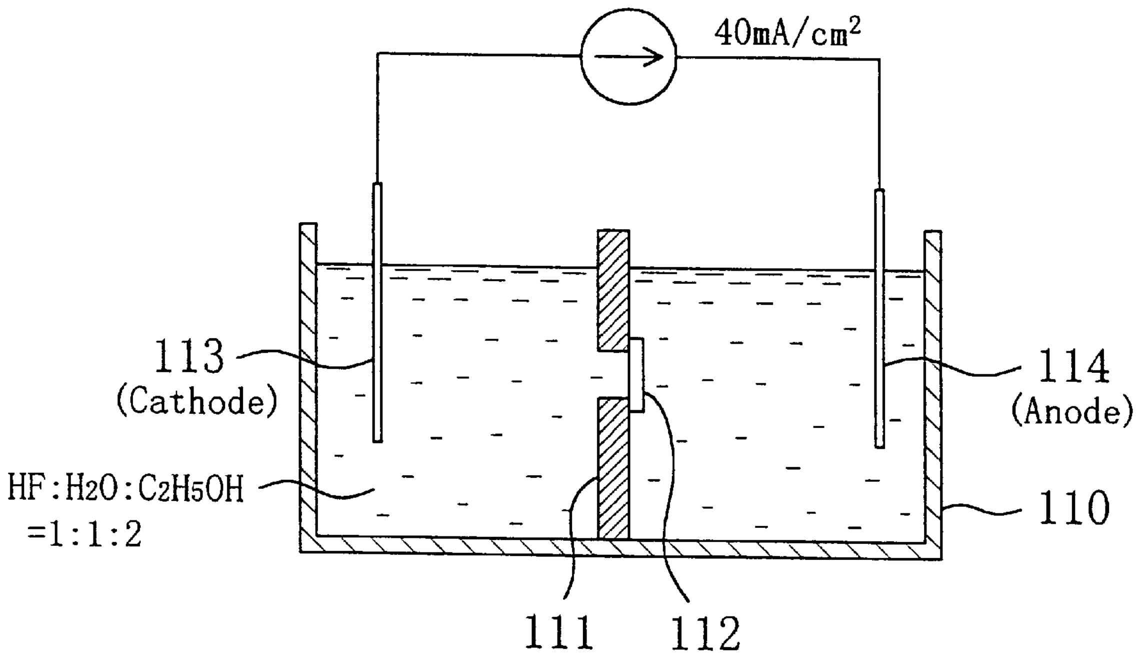
Fig. 23 Prior art
FIG. 23 is a cross-sectional view of an anodizing apparatus for use in the manufacturing of the field-emission electron source according to the third conventional embodiment.

FIG. 18(*b*) shows the cross-sectional structure of a porous layer 107*a* made of silicon and formed by anodization (etching) over the surface of the cathode 107 in the field-emission electron source according to the third conventional embodiment. As shown in the drawing, since the porous layer 107*a* has been formed by anodization, the tip portion of the cathode 17 has an obtuse configuration, resulting in an increased and varied radius of curvature. Consequently, device characteristics have varied in the third conventional embodiment, which renders device design difficult and reduces the reliability of the resulting device, presenting a serious problem to the practical applications.

In the field-emission electron source according to the fifth embodiment, by contrast, the surface coating layer 23 composed of the ultra-fine particulate structure has been formed on the surface of the cathode 17 so that the tip portion of the cathode 17 is prevented from having an obtuse configuration. Accordingly, the radius of curvature of the tip portion is not increased nor varied, resulting in easier device design and higher reliability of the device.

With the microstructured tip portion of the cathode, the radius of curvature of the tip portion is a parameter exerting a particularly great influence on the characteristics of the operating voltage during electron emission. If the relationship between the radius of curvature and a coefficient of electrostatic focusing is simulated on the assumption that the conditions other than the radius of curvature are the same, the coefficient of electrostatic focusing at the tip portion with the radius of curvature of 2 nm is approximately double the coefficient of electrostatic focusing at the tip portion with the radius of curvature of 10 nm. In other words, the coefficient of electrostatic focusing is approximately halved when the radius of curvature of the tip portion of the cathode is increased from 2 to 10 nm. Thus, the fundamental characteristics of the device such as operating current and operating voltage are greatly changed by a slight change on the order of nanometers in the radius of curvature of the tip portion of the cathode.

Since an electron emitting site is susceptible to the adsorbing action of the molecules of the residual gas in vacuum, an apparent work function changes due to the adsorption or desorption of the gas molecules, resulting in an unstable emitted current. In the fifth embodiment, however, the surface coating layer 23 composed of the ultra-fine particulate structure has been formed over the surface of the cathode 17, so that variations in the quantity of emitted electrons are eliminated by the averaging effect of numerous ultra-fine particles. This provides an extremely stable electron emitting property, while a drastic increase in the quantity of emitted electrons is suppressed, thereby eliminating the problem of the destroyed cathode resulting from an extraordinary increase in the quantity of emitted electrons.

As is apparent from comparison between FIGS. 18(*a*) and 18(*b*), the number of electron emitting sites in the surface coating layers 23 composed of the ultra-fine particulate structure in the fifth embodiment is much larger than the number of electron emitting sites in the porous layer 107*a* in the third conventional embodiment. Therefore, an extremely large quantity of electrons are emitted from the surface coating layer 23 over the cathode 17, while a more stable current flows from the cathode 17 during electron emission since the apparent work function is less likely to change.

Thus, in the field-emission electron source according to the fifth embodiment, the operating current and operating voltage can be reduced, while device characteristics such as operating current and operating voltage do not vary.

The ultra-fine particulate structure composing the surface coating layer 23 may be made of a low-work-function material other than silicon, such as diamond, DLC (Diamond Like Carbon), or ZrC.

A description will be given to a method of manufacturing a field-emission electron source according to the fifth embodiment with reference to FIGS. 13 to 15.

First, as shown in FIG. 13(*a*), a first silicon oxide film 12 is formed by thermal oxidation on the (100) crystal plane of the silicon substrate 11 made of a silicon crystal, followed by the deposition of a photoresist film 13 on the first silicon oxide film 12.

Next, as shown in FIG. 13(*b*), the photoresist film 13 is subjected to photolithography for forming disk-shaped resist masks 13A each having a diameter of about 0.5 $\mu$m. Subsequently, anisotropic dry etching is performed with respect to the first silicon oxide film 12 by using the resist masks 13A, thereby transferring the pattern of the resist masks 13A to the first silicon oxide film 12 and forming silicon oxide masks 12A therefrom.

Next, as shown in FIG. 13(*c*), the removal of the resist masks 13A is followed by anisotropic dry etching performed with respect to the silicon substrate 11 by using the silicon oxide masks 12A, thereby forming cylindrical elements 14A on the surface of the silicon substrate 11.

Next, as shown in FIG. 13(*d*), wet etching is performed with respect to the cylindrical elements 14A by using an etching agent having crystal anisotropy, such as an aqueous solution of ethylene diamine and pyrocatechol, thereby forming hourglass elements 14B each having a side surface including the (331) crystal plane and constricted in the middle. In this case, the diameter of the silicon oxide mask 12A and the degree of constriction of the hourglass element 14B are optimumly determined so that the microstructured hourglass elements 14B each having the constricted portion with a diameter of about 0.1 $\mu$m are formed uniformly with high reproducibility.

Next, as shown in FIG. 14(*a*), second silicon oxide films each having a reduced thickness of about 10 nm are formed on the sidewalls of the hourglass elements 14B by thermal oxidation to protect the constricted portions of the hourglass elements 14B. Thereafter, anisotropic dry etching is performed with respect to the silicon substrate 11 by using again the silicon oxide masks 12A to vertically etch the silicon substrate 11, thereby forming cylindrical elements 14C with respective hourglass heads on the surface of the silicon substrate 11, as shown in FIG. 14(*b*).

Next, as shown in FIG. 14(*c*), a third silicon oxide film 16 having a thickness of about 100 nm is formed by thermal oxidation over the surfaces of the cylindrical elements 14C with respective hourglass heads and of the silicon substrate 11, thereby forming cathodes 17 inside the cylindrical elements 14C with respective hourglass heads. The third silicon oxide film 16 thus formed on the surfaces of the hourglass elements 14C is for sharply tapering the tip portions of the cathodes 17 and enhancing the insulating property of an insulating film underlying the withdrawn electrode, which will be described later. In this case, if thermal oxidation is performed at a temperature of about 900° C., which is lower than the melting point of silicon oxide, a stress develops in the vicinity of the interface between the cathode 17 made of silicon and the third silicon oxide film 16 during thermal oxidation, so that the resulting cathode 17 has a tip portion sharply tapered. Moreover, the silicon oxide film formed by thermal oxidation is superior in film quality to a silicon oxide film formed by another method such as vapor deposition, so that it has high insulation resistance. As a result, there can be formed a highly reliable device exhibiting an excellent insulating property during the application of a voltage to the withdrawn electrode, which will be described later.

Next, as shown in FIG. 14(*d*), a fourth silicon oxide film 18 used as an insulating film and a conductive film 19 used as the withdrawn electrode are successively deposited by vacuum vapor deposition over the entire surface of the semiconductor substrate 11 including the top surfaces of the silicon oxide masks 12A. During the formation of the fourth silicon oxide film 18 by vacuum vapor deposition, ozone gas is introduced so as to form a high-quality silicon oxide film excellent in insulating property. The use of a Nb metal film as the conductive film 19 enables the formation of a uniform withdrawn electrode during a lift-off process, which will be described later.

Figure 15A:
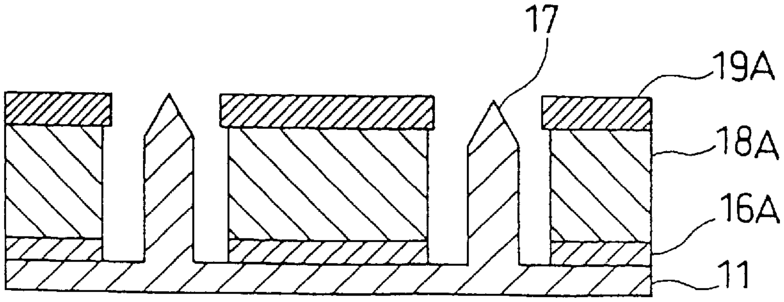
FIGS. 15(*a*) and 15(*b*) are cross-sectional views illustrating individual process steps in the method of manufacturing the field-emission electron source according to the fifth embodiment.
Figure 15B:
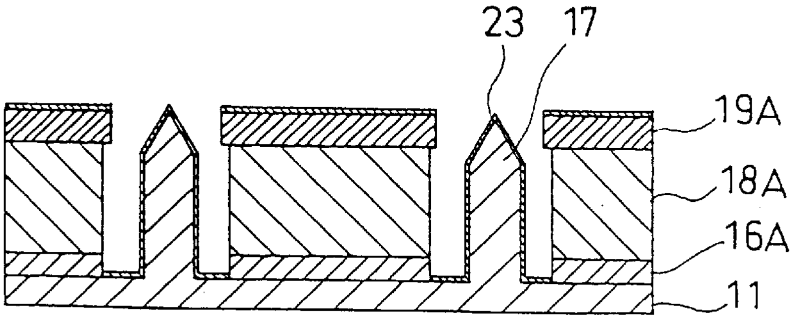
Figure 16A:
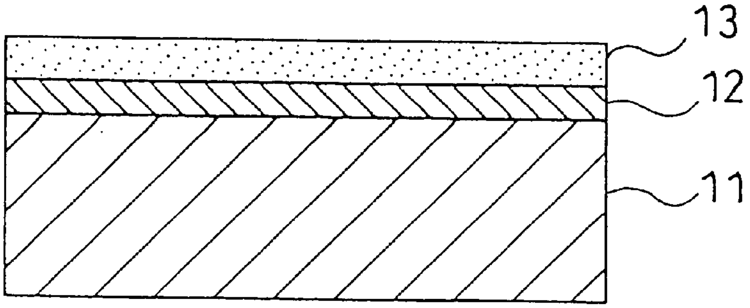
FIGS. 16(*a*) to 16(*d*) are cross-sectional views illustrating individual process steps in a method of manufacturing the field-emission electron source according to the sixth embodiment.
Figure 16B:
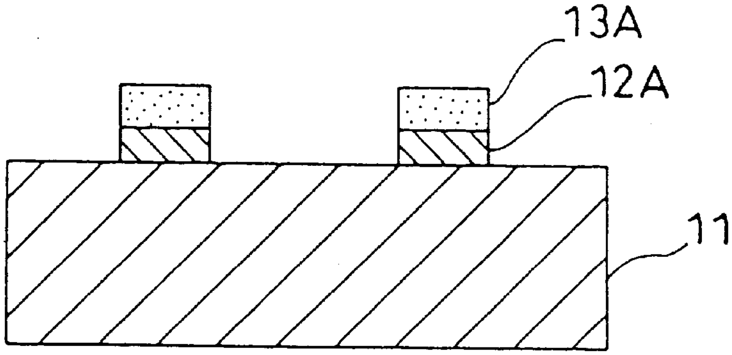
Figure 16C:
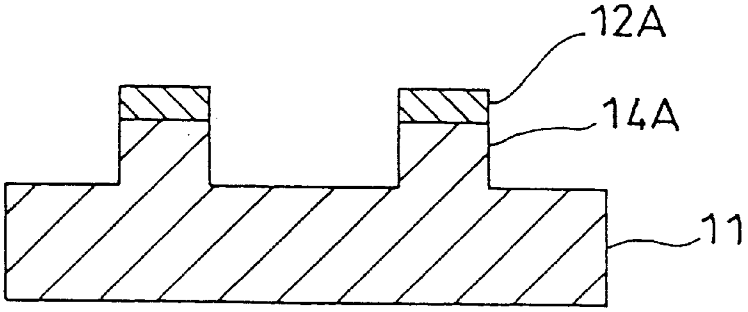
Figure 16D:
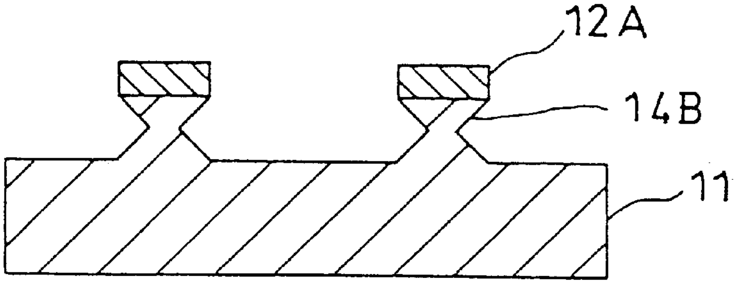
Figure 17A:
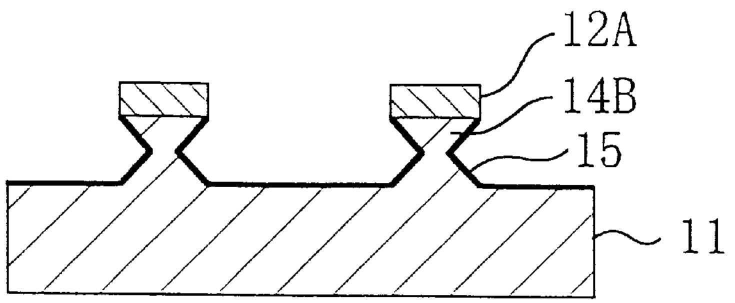
FIGS. 17(*a*) to 17(*d*) are cross-sectional views illustrating individual process steps in the method of manufacturing the field-emission electron source according to the sixth embodiment.
Figure 17B:
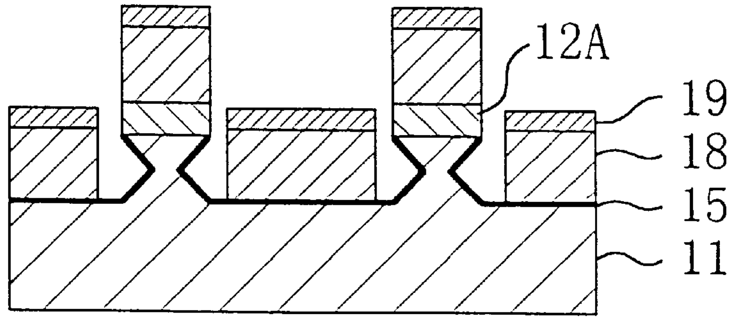
Figure 17C:
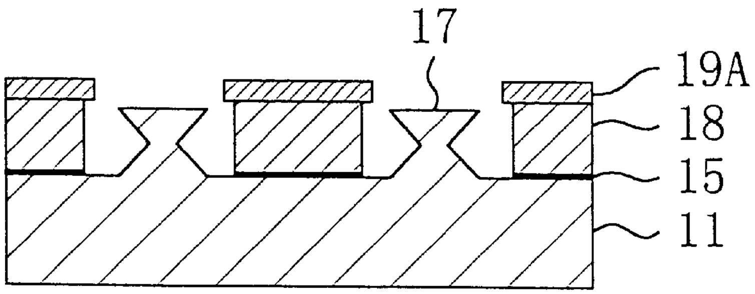
Figure 17D:
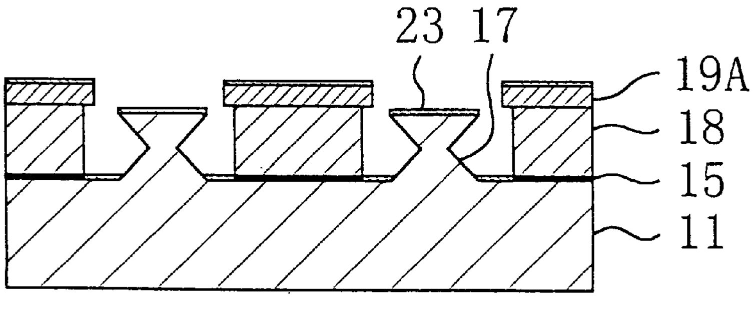

Next, as shown in FIG. 15(*a*), wet etching is performed by using a buffered hydrofluoric acid in an ultrasonic atmosphere to selectively remove the sidewall portions of the cathodes 17 and the silicon oxide masks 12A, thereby lifting off the conductive film 19 deposited on the silicon oxide masks 12A, while exposing the withdrawn electrode 19A having small openings and the cathodes 17. In this case, the duration of wet etching is controlled such that the third and fourth silicon oxide films 16 and 18 are overetched. In this manner, the circumferential surfaces of the openings of the upper and lower silicon oxide films 18A and 16A are recessed relative to the circumferential surface of the opening of the withdrawn electrode 19A.

Next, as shown in FIG. 15(*b*), the surface coating layer 23 composed of the ultra-fine particulate structure is deposited over the entire surface of the silicon substrate 11 including the cathodes 17 by laser ablation, resulting in the field-emission electron source according to the fifth embodiment.

In this case, the type (undoped-type, p-type, or n-type) and resistivity of the silicon substrate as a target used in laser ablation may be determined in accordance with the preferred properties of the surface coating layer 23. As a light source for laser ablation, an ArF excimer laser having high energy is preferred.

By optimizing process conditions for laser ablation, the surface coating layer 23 composed of ultra-fine particles having a desired diameter and deposited in a desired number of layers can be formed over the surface of the cathode 17. Under specific process conditions, an ArF excimer laser beam with a pulse width of 12 nsec and a repetitive frequency of 10 Hz is radiated and focused on a spot of 3×1 mm at an energy density of 1 J/cm$^2$ on a silicon wafer used as the target. Under the conditions, the ablation rate for the target composed of the silicon wafer is 0.2 $\mu$m/pulse. The laser ablation is performed under time control, while maintaining a basic degree of vacuum at $1\times10^{-6}$ Torr and introducing He gas at a given flow rate. By optimumly determining the pressure (flow rate) of the He gas, the surface coating layer 23 composed of the ultra-fine particulate structure constituted by ultra-fine particles having diameters on the order of nanometers can be formed with high reproducibility. By adjusting the thickness of the surface coating layer 23 composed of the ultra-fine particulate structure formed by laser ablation to be about 10 nm or less, the configuration of the cathode 17 can be reproduced with high fidelity in the surface coating layer 23 so that the tip portion of the surface coating film 23 has a sharply tapered configuration.

Since the method of manufacturing the field-emission electron source according to the fifth embodiment has used laser ablation, there is no possibility that the surface of the cathode 17 suffers damage during the process, while the surface coating layer 23 composed of the uniform ultra-fine particulate structure can be formed without impairing the extremely small configuration of the cathode 17. Furthermore, the manufacturing method enables the formation of an array of extremely small field-emission electron sources at a high density with high precision through the excellently uniform and reproducible process.

As the target for laser ablation, there can be used a low-work-function material other than silicon, such as diamond, DLC, or ZrC. The use of the target made of silicon increases the productivity, while the use of the other low-work-function materials lowers the voltage of the operating current.

Sixth Embodiment

Figure 6A:
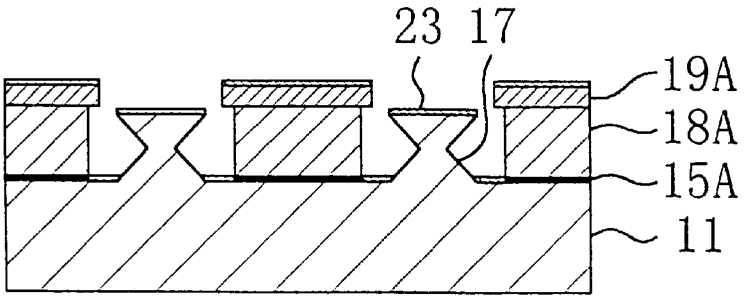
FIGS. 6(*a*) and 6(*b*) show a field-emission electron source according to a sixth embodiment of the present invention, of which FIG. 6(*a*) is a cross-sectional view taken along the line VI—VI of FIG. 6(*b*) and FIG. 6(*b*) is a plan view.
Figure 6B:
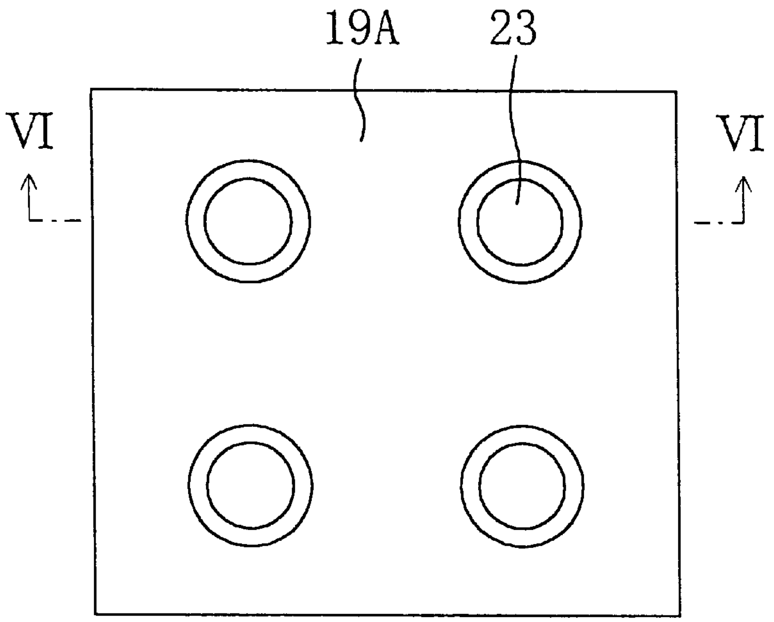
Figure 7A:
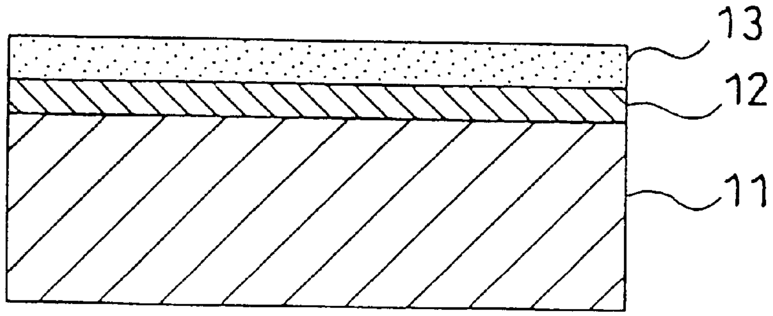
FIGS. 7(*a*) to 7(*d*) are cross-sectional views illustrating individual process steps in a method of manufacturing the field-emission electron source according to the first embodiment.
Figure 7B:
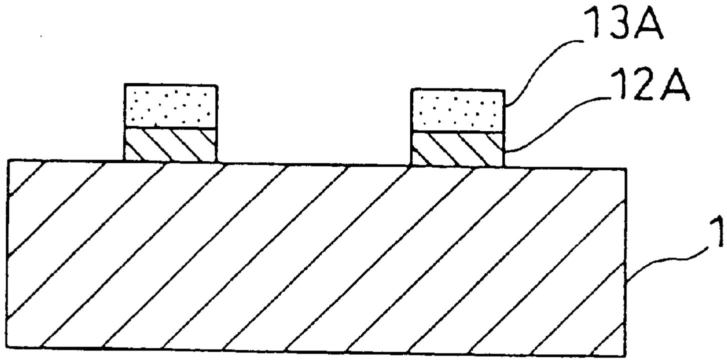
Figure 7C:
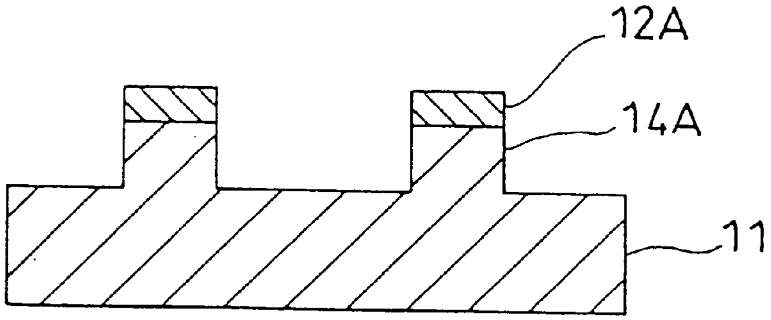
Figure 7D:
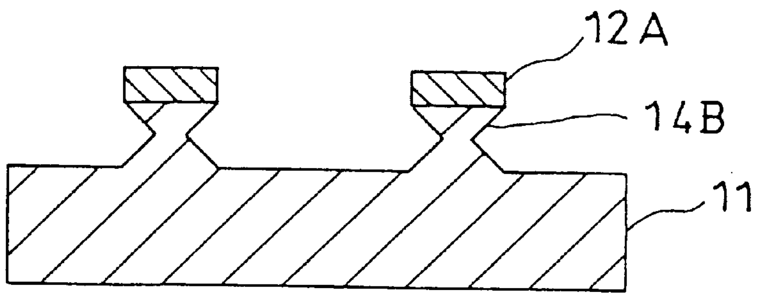
Figure 8A:
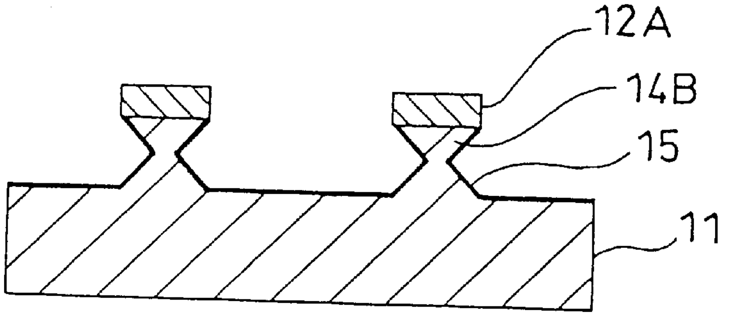
FIGS. 8(*a*) to 8(*d*) are cross-sectional views illustrating individual process steps in the method of manufacturing the field-emission electron source according to the first embodiment.
Figure 8B:
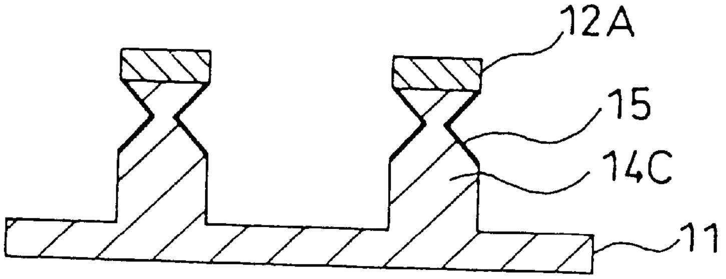
Figure 8C:
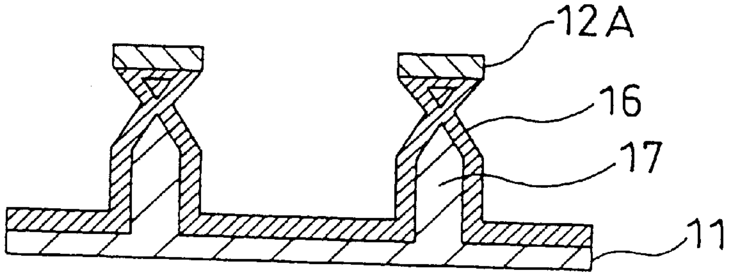
Figure 8D:
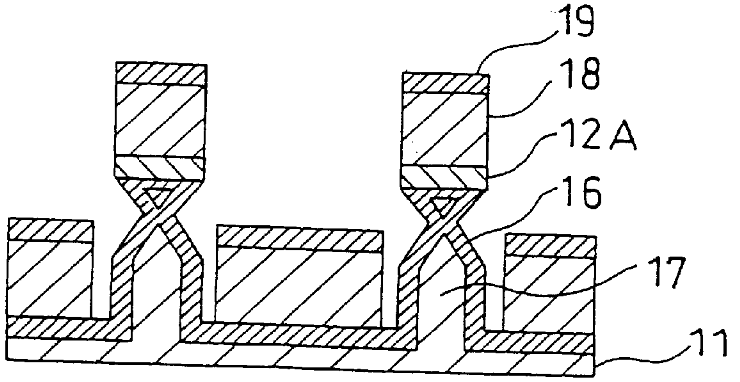

Referring to FIGS. 6, a field-emission electron source according to a sixth embodiment of the present invention will be described. FIG. 6(*a*) shows a cross-sectional structure taken along the line VI—VI of FIG. 6(*b*) and FIG. 6(*b*) shows a plan structure.

As shown in FIGS. 6(*a*) and 6(*b*), a withdrawn electrode 19A is formed on a silicon substrate 11 made of a silicon crystal with intervention of an insulating film consisting of upper and lower silicon oxide films 18A and 16A each having circular openings corresponding to regions in which cathodes are to be formed, which have been arranged to form an array. In this case, the diameter of the opening of the withdrawn electrode 19A is smaller than the diameters of the respective openings of the upper and lower silicon oxide films 18A and 16A so that the circumferential surfaces of the openings of the upper and lower silicon oxide films 18A and 16A are recessed relative to the circumferential surface of the opening of the withdrawn electrode 19A.

In the openings of the upper and lower silicon oxide films 18A and 16A and of the withdrawn electrode 19A, there are formed cathodes 17 each having a cocktail-glass-like configuration composed of a pair of truncated cones with their top surfaces joined to each other and having a side surface including the (331) crystal plane. The upper circumferential edge of the cathode 17 has a sharply sloped cross section with a radius of about 2 nm, which has been formed by crystal anisotropic etching and thermal oxidation process. The portion of the silicon substrate 11 exposed in the respective openings of the upper and lower silicon oxide films 18A and 16A and the cathode 17 have their surfaces coated with a surface coating layer 23 composed of an ultra-fine particulate structure. A material composing the surface coating layer 23 preferably has a low work function so that electrons are emitted positively. As the ultra-fine particles composing the surface coating layer 23, silicon particles each having a diameter on the order of nanometers, i.e., a diameter of 10 nm or less are preferred in terms of the efficiency of electron emission. Preferably, ultra-fine particles composing the surface coating layer 23 are deposited in a single or several layers. In the case where the silicon particle has a diameter of about 10 nm, a single layer of silicon particles is sufficient. In the case where the silicon particle has a diameter of about 5 nm, silicon particles are preferably deposited in two or three layers.

In the arrangement, the surface coating layer 23 composed of the ultra-fine particulate structure has been formed on the surface of the cathode 17 so that the tip portion of the cathode 17 is prevented from having an obtuse configuration. Accordingly, the radius of curvature of the top portion is not increased nor varied, resulting in easier device design and higher reliability of the device, similarly to the fifth embodiment.

Moreover, since the surface coating layer 23 composed of the ultra-fine particulate structure has been formed over the surface of the cathode 17, variations in the quantity of emitted electrons are eliminated by the averaging effect of numerous ultra-fine particles, similarly to the fifth embodiment. This provides an extremely stable electron emitting property, while a drastic increase in the quantity of emitted electrons is suppressed, thereby eliminating the problem of the destroyed cathode resulting from an extraordinary increase in the quantity of emitted electrons.

Furthermore, since an extremely large number of electron emitting sites are present in the surface coating layers 23 composed of the ultra-fine particulate structure, similarly to the fifth embodiment, an extremely large quantity of electrons are emitted from the surface coating layer 23, while a more stable current flows from the cathode 17 during electron emission since the apparent work function is less likely to change.

Thus, in the field-emission electron source according to the sixth embodiment, the operating current and operating voltage can be reduced, while device characteristics such as operating current and operating voltage do not vary.

The ultra-fine particulate structure composing the surface coating layer 23 may be made of a low-work-function material other than silicon, such as diamond, DLC, or ZrC.

A description will be given to a method of manufacturing a field-emission electron source according to the sixth embodiment with reference to FIGS. 16 and 17.

First, as shown in FIG. 16(*a*), a first silicon oxide film 12 is formed by thermal oxidation on the (100) crystal plane of the silicon substrate 11 made of a silicon crystal, followed by the deposition of a photoresist film 13 on the first silicon oxide film 12.

Next, as shown in FIG. 16(*b*), the photoresist film 13 is subjected to photolithography for forming disk-shaped resist masks 13A each having a diameter of about 0.5 μm. Subsequently, anisotropic dry etching is performed with respect to the first silicon oxide film 12 by using the resist mask 13A, thereby transferring the pattern of the resist masks 13A to the first silicon oxide film 12 and forming silicon oxide masks 12A therefrom.

Next, as shown in FIG. 16(*c*), the removal of the resist masks 13A is followed by anisotropic dry etching performed with respect to the silicon substrate 11 by using the silicon oxide masks 12A, thereby forming cylindrical elements 14A on the surface of the silicon substrate 11.

Next, as shown in FIG. 16(*d*), wet etching is performed with respect to the cylindrical elements 14A by using an etching agent having crystal anisotropy, such as an aqueous solution of ethylene diamine and pyrocatechol, thereby forming hourglass elements 14B each having a side surface including the (331) crystal plane and constricted in the middle. In this case, the diameter of the silicon oxide mask 12A and the degree of constriction of the hourglass element 14B are optimumly determined so that the microstructured hourglass elements 14B each having the constricted portion with a diameter of about 0.1 μm are formed uniformly with high reproducibility.

Next, as shown in FIG. 17(*a*), second silicon oxide films 15 each having a reduced thickness of about 10 to 20 nm are formed on the sidewalls of the hourglass elements 14B by thermal oxidation.

Next, as shown in FIG. 17(*b*), a third silicon oxide film 18 used as an insulating film and a conductive film 19 used as a withdrawn electrode are successively deposited by vacuum vapor deposition over the entire surface of the semiconductor substrate 11 including the top surfaces of the silicon oxide masks 12A. During the formation of the third silicon oxide film 18 by vacuum vapor deposition, ozone gas is introduced so as to form a high-quality silicon oxide film excellent in insulating property. The use of a Nb metal film as the conductive film 19 enables the formation of a uniform withdrawn electrode during a lift-off process, which will be described later.

Next, as shown in FIG. 17(*c*), wet etching is performed by using a buffered hydrofluoric acid in an ultrasonic atmosphere to selectively remove the sidewall portions of the cathodes 17 and the silicon oxide masks 12A, thereby lifting off the conductive film 19 deposited on the silicon oxide masks 12A, while exposing the withdrawn electrode 19A having small openings and the cathodes 17. In this case, the duration of wet etching is controlled such that the third and fourth silicon oxide films 16 and 18 are overetched. In this manner, the circumferential surfaces of the openings of the upper and lower silicon oxide films 18A and 16A are recessed relative to the circumferential surface of the opening of the withdrawn electrode 19A.

Next, as shown in FIG. 17(*d*), the surface coating layer 23 composed of the ultra-fine particulate structure is deposited over the entire surface of the silicon substrate 11 including the cathodes 17 by laser ablation, resulting in the field-emission electron source according to the sixth embodiment.

Thus, the surface coating layer 23 composed of the ultra-fine particulate structure constituted by ultra-fine particles each having a desired diameter can be formed on the upper circumferential edge of the top surface of the cathode 17 having a cocktail-glass-like configuration, so that the sharply sloped cross-sectional configuration of the cathode 17 is reflected faithfully in the surface coating layer 23. As a result, the surface coating film 23 has a sharply sloped tip portion.

Since the surface coating layer 23 has been formed by laser ablation, there is no possibility that the surface of the cathode 17 suffers damage during the process. Moreover, the excellently uniform and reproducible process enables the formation of an array of extremely small field-emission electron sources at a high density with high precision.

Although the cathode 17 has a tower-like configuration in the fifth embodiment and a cocktail-glass-like configuration in the sixth embodiment, it may have a conical configuration instead.

Instead of the silicon substrate 11, a substrate made of another semiconductor material such as a compound semiconductor of GaAs or the like may be used.

We claim:

1. A field-emission electron source comprising;

substrate;

a withdrawn electrode formed an said substrate with an insulating film interposed therebetween and having an opening;

a cathode forming a projection on said substrate and in the opening of said withdrawn electrode, said cathode being made of the same material as said substrate and having the same impurity concentration as said substrate; and a high-concentration impurity layer formed in a surface region of said cathode and containing an impurity at a concentration higher than the impurity concentration of said cathode.

2. A field-emission electron source according to claim 1, wherein said cathode has a tower-like configuration and said high-concentration impurity layer is formed in the surface region of said cathode and in a surface region of a portion of said substrate exposed in the opening of said withdrawn electrode.

3. A field-emission electron source according to claim 1, wherein said high-concentration impurity layer has a sheet resistivity of 10 kΩ or less.

4. A field-emission electron source comprising:

a substrate;

a withdrawn electrode formed on said substrate with an insulating film interposed therebetween and having an opening;

a cathode formed on said substrate and in the opening of said withdrawn electrode: and a surface coating layer composed of an ultra-fine particulate structure and formed over a whole surface of said cathode and a surface of the substrate at least in a portion which surrounds the bottom of said cathode, wherein said ultra-fine particulate structure is constituted by a group of uniform ultra-fine particles each having a diameter of 10 nm or less.

5. A field-emission electron source according to claim 4, wherein said cathode is tower-shaped.

* * * * *